(12) United States Patent
Meyer et al.

(10) Patent No.: US 11,205,891 B2
(45) Date of Patent: Dec. 21, 2021

(54) ARC FAULT DETECTION UNIT

(71) Applicant: Siemens Aktiengesellschaft, Munich (DE)

(72) Inventors: Joerg Meyer, Dresden (DE); Peter Schegner, Dresden (DE); Karsten Wenzlaff, Dresden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 415 days.

(21) Appl. No.: 16/305,131

(22) PCT Filed: May 31, 2016

(86) PCT No.: PCT/EP2016/062271
§ 371 (c)(1),
(2) Date: Nov. 28, 2018

(87) PCT Pub. No.: WO2017/207029
PCT Pub. Date: Dec. 7, 2017

(65) Prior Publication Data
US 2020/0326365 A1      Oct. 15, 2020

(51) Int. Cl.
*H02H 1/00*       (2006.01)
*H02H 3/38*       (2006.01)
(Continued)

(52) U.S. Cl.
CPC ............ *H02H 1/0015* (2013.01); *H02H 3/38* (2013.01); *G01R 31/1272* (2013.01); *H02H 1/0092* (2013.01); *H02H 3/023* (2013.01)

(58) Field of Classification Search
CPC ............... G01R 31/024; G01R 31/025; G01R 31/1272; H02H 1/0015; H02H 3/16;
(Continued)

(56) References Cited

U.S. PATENT DOCUMENTS

| 4,780,789 A | 10/1988 | Kugler et al. |
| 5,726,577 A | 3/1998 | Engel et al. |

(Continued)

FOREIGN PATENT DOCUMENTS

| CA | 1210847 A | 9/1986 |
| CN | 101395777 A | 3/2009 |

(Continued)

OTHER PUBLICATIONS

Chinese Office Action and English translation thereof for Chinese Application No. 2016800877078 dated Sep. 2, 2015.

(Continued)

*Primary Examiner* — Fred E Finch, III
(74) *Attorney, Agent, or Firm* — Harness, Dickey & Pierce, P.L.C.

(57) ABSTRACT

A fault-arc identification unit for an electric circuit, includes at least one voltage sensor, for the periodic determination of electric voltage values; and at least one current sensor, for the periodic determination of electric current variables of the circuit. Both sensors are connected to an evaluation unit, designed such that: electric voltage values are fed to a first fault-arc identification function which carries out a first fault-arc identification based upon a signal profile of the voltage, and emits a first fault-arc identification signal upon a first threshold value being exceeded; electric voltage values and current variables are fed to a second fault-arc identification function which carries out a second fault-arc identification based upon the voltage values and current variables, and emits a second fault-arc identification signal upon a second threshold value being exceeded. The fault-arc identification signals are fed to an inclusive disjunction function, to emit a fault-arc identification signal.

26 Claims, 5 Drawing Sheets

(51) Int. Cl.
*H02H 3/02* (2006.01)
*G01R 31/12* (2020.01)

(58) Field of Classification Search
CPC ........ H02H 3/162; H02H 3/165; H02H 3/023; H02H 3/38
See application file for complete search history.

(56) References Cited

U.S. PATENT DOCUMENTS

| | | | |
|---|---|---|---|
| 6,654,219 | B1 | 11/2003 | Romano et al. |
| 6,987,389 | B1 | 1/2006 | Macbeth et al. |
| 7,268,989 | B2 | 9/2007 | Parker et al. |
| 2005/0017731 | A1* | 1/2005 | Zuercher ............. H02H 1/0015 324/536 |
| 2006/0012931 | A1 | 1/2006 | Engel et al. |
| 2006/0109009 | A1* | 5/2006 | Banke ................ G01R 31/1227 324/536 |
| 2006/0227469 | A1 | 10/2006 | Parker et al. |
| 2007/0086124 | A1* | 4/2007 | Elms ..................... H02H 1/043 361/10 |
| 2007/0208520 | A1 | 9/2007 | Zhang et al. |
| 2008/0106832 | A1 | 5/2008 | Restrepo et al. |
| 2008/0129307 | A1 | 6/2008 | Yu et al. |
| 2009/0040665 | A1 | 2/2009 | Elms et al. |
| 2011/0019444 | A1* | 1/2011 | Dargatz .................. H02H 3/00 363/50 |
| 2011/0128005 | A1 | 6/2011 | Weiher |
| 2012/0056637 | A1 | 3/2012 | Jeong et al. |
| 2012/0134058 | A1 | 5/2012 | Pamer et al. |
| 2013/0169290 | A1 | 7/2013 | Shea |
| 2014/0071575 | A1 | 3/2014 | Parker et al. |
| 2014/0160603 | A1* | 6/2014 | Parker ................. H02H 1/0092 361/42 |
| 2014/0247066 | A1 | 9/2014 | Chaintreuil et al. |
| 2016/0111870 | A1 | 4/2016 | Murano et al. |
| 2016/0187410 | A1 | 6/2016 | Kolker et al. |
| 2016/0241017 | A1 | 8/2016 | Schroeder et al. |
| 2017/0170644 | A1* | 6/2017 | Andrea .................. H01H 33/26 |
| 2017/0343598 | A1* | 11/2017 | Meyer ..................... H02H 3/16 |
| 2019/0011492 | A1* | 1/2019 | Handy ................ G01R 31/008 |
| 2019/0120892 | A1* | 4/2019 | Dzienis ................ H04B 1/0042 |

FOREIGN PATENT DOCUMENTS

| | | | |
|---|---|---|---|
| CN | 101523681 | A | 9/2009 |
| CN | 101573847 | A | 11/2009 |
| CN | 101696986 | A | 4/2010 |
| CN | 102401869 | | 4/2012 |
| CN | 102565578 | A | 7/2012 |
| CN | 102916415 | A | 2/2013 |
| CN | 103635820 | A | 3/2014 |
| CN | 103645396 | A | 3/2014 |
| CN | 203774769 | U | 8/2014 |
| CN | 104620349 | A | 5/2015 |
| CN | 204462364 | U | 7/2015 |
| CN | 104898008 | A | 9/2015 |
| CN | 105445587 | A | 3/2016 |
| DE | 102013001612 | A1 | 8/2013 |
| EP | 0509652 | A2 | 10/1992 |
| EP | 0802602 | A2 | 10/1997 |
| EP | 2426802 | A2 | 3/2012 |
| EP | 2916455 | A1 | 9/2015 |
| GB | 2510871 | A | 8/2014 |
| TW | 217471 | B | 12/1993 |
| WO | WO-2008146040 | A1 * | 12/2008 ........... H02H 1/0061 |
| WO | WO-2009008871 | A1 | 1/2009 |
| WO | WO-2009/156513 | A1 | 12/2009 |

OTHER PUBLICATIONS

Chinese Office Action and English translation thereof dated Jul. 18, 2019.
International Search Report PCT/ISA/210 for International Application No. PCT/EP2016/062272 dated May 31, 2016.
International Search Report PCT/ISA/210 for International Application No. PCT/EP2016/062274 dated May 31, 2016.
International Search Report PCT/ISA/210 for International Application No. PCT/EP2017/062980 dated May 30, 2017.
International Search Report PCT/ISA/210 for International Application No. PCT/EP2016/062273 dated May 31, 2016.
U.S. Notice of Allowance for corresponding U.S. Appl. No. 16/305,109 dated Mar. 25, 2021.
International Search Report PCT/ISA/210 for International Application No. PCT/EP2016/062271 dated Mar. 9, 2017.
U.S. Notice of Allowance for corresponding U.S. Appl. No. 16/305,120 dated Apr. 5, 2021.
U.S. Notice of Allowance for corresponding U.S. Appl. No. 16/305,102 dated Mar. 3, 2021.
Chinese Office Action and English translation thereof dated Jul. 2, 2019.
U.S. Office Action for copending U.S. Appl. No. 16/305,102 dated Dec. 21, 2020.
Chinese Office Action and English translation thereof for Chinese Application No. 2017800461033 dated Jul. 25, 2019.
Chinese Office Action and English translation thereof for Chinese Application No. 2016800879980 dated Jul. 18, 2019.
U.S. Office Action for corresponding U.S. Appl. No. 16/305,132 dated Jun. 8, 2021.
U.S. Office Action for corresponding U.S. Appl. No. 16/305,102 dated Jul. 12, 2021.

* cited by examiner

ARC FAULT DETECTION UNIT

PRIORITY STATEMENT

This application is the national phase under 35 U.S.C. § 371 of PCT International Application No. PCT/EP2016/062271 which has an International filing date of May 31, 2016, which designated the United States of America, the entire contents of which are hereby incorporated herein by reference.

FIELD

Embodiments of the invention relates to an arc fault detection unit, a circuit breaker, a short-circuiting device and a method for arc fault detection.

BACKGROUND

In low-voltage circuits or low-voltage systems, or low-voltage grids, respectively, that is to say circuits for voltages of up to 1000 volts AC or 1500 volts DC, short circuits are for the most part associated with occurring arc faults, such as parallel or series arc faults. Particularly in high-performance distribution and switching systems, the arc faults can lead to devastating destruction of operating equipment, system parts or entire switching systems if not disconnected sufficiently rapidly. To avoid a longer-lasting and extensive failure of the power infeed and to reduce bodily harm, it is necessary to detect such arc faults, in particular high-current or parallel arc faults, respectively, within a few milliseconds and to extinguish them. Conventional protective systems of power infeed systems (for example fuses and circuit breakers) cannot provide reliable protection under the required time requirements.

Here, circuit breakers refer, in particular, to switches for low voltage. Circuit breakers are typically used, particularly in low-voltage systems, for currents of between 63 and 6300 amps. More specifically, closed circuit breakers, such as molded case circuit breakers, are used for currents of between 63 and 1600 amps, in particular of between 125 and 630 or 1200 amps. Open circuit breakers or air circuit breakers are used, in particular, for currents of between 630 and 6300 amps, more specifically of between 1200 and 6300 amps.

Circuit breakers in the context of the invention can have, in particular, an electronic trip unit, ETU for short.

Circuit breakers monitor the current flowing through them and interrupt the electric current or energy flow to an energy sink or a load, which is referred to as tripping, when current limit values or current time span limit values are exceeded, that is to say when a current value is present for a certain time span. The determination of tripping conditions and the tripping of a circuit breaker can take place via an electronic trip unit.

Short-circuiting devices are specific devices for short-circuiting lines or busbars in order to produce defined short circuits for protecting circuits or systems.

Conventional arc fault detection systems evaluate the light emission generated by the arc and hereby detect the arc fault.

SUMMARY

The inventors have recognized that the conventional fault arc detection systems have a disadvantage that optical waveguides or optical detection systems, respectively, have to be installed in parallel with the electrical lines or busbars in order to detect possibly occurring arc faults.

At least one embodiment of the present invention specifies a possibility for arc fault detection.

Embodiments of the present invention are directed to an arc fault detection unit, a circuit breaker, a short-circuiting device and a method.

According to at least one embodiment of the invention, an arc fault detection unit for an electrical circuit comprises
at least one voltage sensor assigned to the circuit, for periodically determining electrical voltage values of the electrical circuit,
at least one current sensor assigned to the circuit, for periodically determining electric current variables of the circuit. Both of these are connected to an evaluation unit, which is configured in such a way
that the electrical voltage values are fed to a first arc fault detection function, which carries out a first arc fault detection on the basis of the signal profile of the voltage and, if a first threshold value (SW1) is exceeded in magnitude, outputs a first arc fault detection signal,
that the electrical voltage values and current variables are fed to a second arc fault detection function, which carries out a second arc fault detection on the basis of the voltage values and current variables and, if a second threshold value (SW2) is exceeded in magnitude, outputs a second arc fault detection signal, and
that the two arc fault detection signals are fed to an OR function so that, in the presence of a first or second arc fault detection signal, an OR-linked arc fault detection signal is output as an output-side arc fault detection signal.

According to at least one embodiment of the invention, an arc fault detection unit for an electrical circuit, comprises:
at least one voltage sensor assigned to the electrical circuit, to periodically determine electrical voltage values of the electrical circuit; and
at least one current sensor assigned to the electrical circuit, to periodically determine electric current variables of the circuit, the at least one voltage sensor and the at least one current sensor being connected to an evaluation unit, the evaluation unit being configured to
feed the electrical voltage values to a first arc fault detection function, to carry out a first arc fault detection based upon a signal profile of the voltage, compare the signal profile to a first threshold value, and to output a first arc fault detection signal upon the electrical voltage values exceeding the first threshold value in magnitude,
feed the electrical voltage values and electric current variables to a second arc fault detection function, to carry out a second arc fault detection based upon the electrical voltage values and current variables, compare at least one of the electrical voltage values and electric current variables to a second threshold value and to output a second arc fault detection signal upon the at least one of the electrical voltage values and electric current variables exceeding the second threshold value in magnitude, and
feed the first arc fault detection signal and the second arc detection signal to an OR function to, upon either of the first arc fault detection signal and second arc fault detection signal being present, output an OR-linked arc fault detection signal as an output-side arc fault detection signal.

According to an embodiment of the invention, a circuit breaker for an electrical circuit, in particular a low-voltage circuit, is also provided. The circuit breaker has an arc fault detection unit according to an embodiment of the invention. The arc fault detection unit is connected to the circuit breaker, wherein these are configured in such a way that, when an arc fault detection signal is output, the circuit breaker trips, that is to say interrupts the electrical circuit. An extinguishing of the arc fault can therefore be achieved. If the circuit breaker has an electronic trip unit, a very rapid tripping of the circuit breaker can be achieved when an arc fault detection signal is present.

According to an embodiment of the invention, a short-circuiting device, having an arc fault detection unit, which is connected to the short-circuiting device, is provided. These are configured in such a way that, when an arc fault detection signal is output, the short-circuiting device short-circuits the electrical circuit in order to cause extinguishing of the arc fault.

According to an embodiment of the invention, a method for arc fault detection for an electrical circuit is also provided, in which method electrical voltage values and current variables of the electrical circuit are determined periodically, the electrical voltage values are fed to a first arc fault detection function, which carries out a first arc fault detection on the basis of the signal profile of the voltage and, if a first threshold value (SW1) is exceeded in magnitude, outputs a first arc fault detection signal. The electrical voltage values and current variables are also fed to a second arc fault detection function, which carries out a second arc fault detection on the basis of the voltage values and current variables and, if a second threshold value (SW2) is exceeded in magnitude, outputs a second arc fault detection signal. The two arc fault detection signals are fed to an OR function so that, in the presence of a first or second arc fault detection signal, an OR-linked arc fault detection signal is output as an output-side arc fault detection signal.

According to an embodiment of the invention, a method for arc fault detection for an electrical circuit, comprises:

periodically ascertaining electrical voltage values and current variables of the electrical circuit;

feeding the electrical voltage values to a first arc fault detection function, to carry out a first arc fault detection based upon a signal profile of the voltage by comparing the signal profile to a first threshold value;

outputting a first arc fault detection signal, upon the comparing indicating that the electrical voltage values periodically ascertained exceeding the first threshold value in magnitude;

feeding the electrical voltage values and current variables to a second arc fault detection function, to carry out a second arc fault detection based upon the electrical voltage values and current variables by comparing the electrical voltage values periodically ascertained, to a second threshold value;

outputting a second arc fault detection signal, upon the comparing indicating that the electrical voltage values periodically ascertained exceed the first threshold value in magnitude;

feeding the first arc fault detection signal and the second arc fault detection signal to an OR function; and outputting an OR-linked arc fault detection signal as an output-side arc fault detection signal.

BRIEF DESCRIPTION OF THE DRAWINGS

The described characteristics, features and advantages of this invention, as well as the way in which they are achieved, become clearer and more easily understandable in connection with the following description of the example embodiments, which will be explained in more detail in connection with the drawings.

In the figures.

DETAILED DESCRIPTION OF THE EXAMPLE EMBODIMENTS

Figure 1:
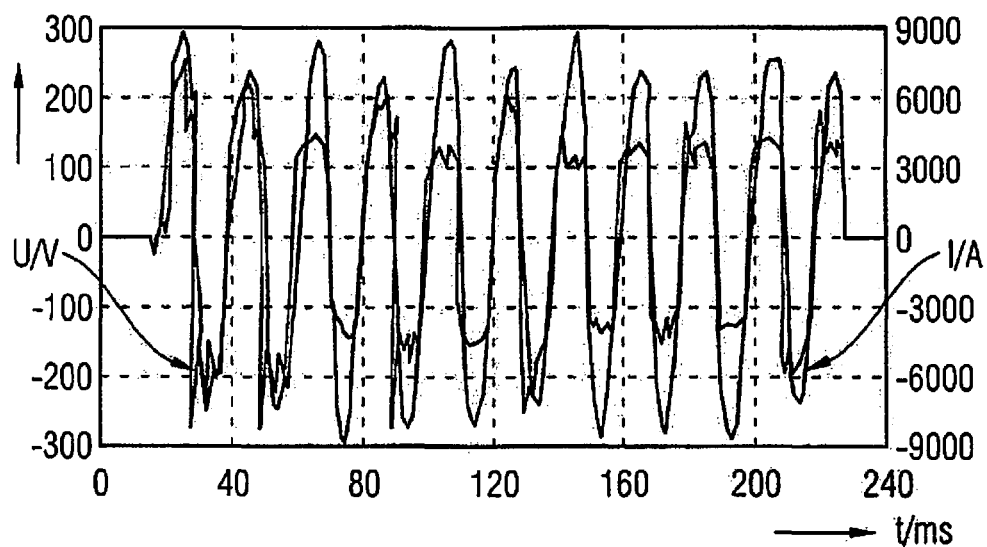
FIG. 1 shows a graph of the voltage and current time profiles after arc ignition

According to at least one embodiment of the invention, an arc fault detection unit for an electrical circuit comprises at least one voltage sensor assigned to the circuit, for periodically determining electrical voltage values of the electrical circuit, at least one current sensor assigned to the circuit, for periodically determining electric current variables of the circuit. Both of these are connected to an evaluation unit, which is configured in such a way that the electrical voltage values are fed to a first arc fault detection function, which carries out a first arc fault detection on the basis of the signal profile of the voltage and, if a first threshold value (SW1) is exceeded in magnitude, outputs a first arc fault detection signal, that the electrical voltage values and current variables are fed to a second arc fault detection function, which carries out a second arc fault detection on the basis of the voltage values and current variables and, if a second threshold value (SW2) is exceeded in magnitude, outputs a second arc fault detection signal, and that the two arc fault detection signals are fed to an OR function so that, in the presence of a first or second arc fault detection signal, an OR-linked arc fault detection signal is output as an output-side arc fault detection signal.

Exceeding in magnitude means both purely exceeding a threshold value in magnitude and exceeding with respect to a positive threshold value and/or a negative threshold value, wherein the magnitude of the threshold value is exceeded in each case. The magnitude of the positive threshold value and of the negative threshold value may be identical but may also deviate from one another.

This has the particular advantage that a comprehensive detection of arc faults is made possible since the presence thereof is checked by way of two functions. Different kinds of arc fault can therefore be identified, and comprehensive system protection can be realized.

Advantageous configurations of the invention are specified in the claims.

In one advantageous configuration of an embodiment of the invention, the circuit is a low-voltage circuit, in particular an AC circuit.

This has the particular advantage that the invention can be used here in a particularly effective manner.

In one advantageous configuration of an embodiment of the invention, the evaluation unit is configured in such a way that the electric current variables are fed to a third arc fault detection function, which continuously compares the current variable or the equivalent thereof with a third threshold value (SW3) and, if the third threshold value is exceeded in magnitude, outputs a third arc fault detection signal, and that the OR-linked arc fault detection signal and the third arc fault detection signal are fed to an AND function so that the output-side arc fault detection signal is output by the arc fault detection unit only in the presence of the third and the OR-linked arc fault detection signal.

This has the particular advantage that there is a further criterion for the presence of arc faults and the erroneous output of an arc fault detection signal is prevented. Arc faults often arise only in the case of relatively high current. According to an embodiment of the invention, this is taken into account in the evaluation.

In one advantageous configuration of an embodiment of the invention, the electrical voltage values and/or current variables are determined with a fixed time interval (dt).

This has the particular advantage that a particularly accurate determination of arc faults is made possible since values are present at regular intervals and the arc fault criteria can thus be identified particularly well.

In one advantageous configuration of an embodiment of the invention, a voltage difference is continuously determined from two temporally successive voltage values. The voltage difference is divided by the temporal difference (dt) of the voltage values. The difference quotient (Dqun) thus determined is compared, as measure for the change in the voltage over the time, with a fourth threshold value (SW4) instead of the first. If the fourth threshold value is exceeded in magnitude, a first arc fault detection signal is output.

This has the particular advantage that a simple first determination possibility for arc faults is available.

In one advantageous configuration of an embodiment of the invention, a first half of a first number of voltage values is continuously summed to form a first partial sum (TS1) and the second half of voltage values is continuously summed to form a second partial sum (TS2). A difference (DU) of the two partial sums is determined. The difference is compared in magnitude with a first threshold value (SW1). If the first threshold value is exceeded, a first arc fault detection signal is output.

This has the particular advantage that a simple but accurate determination of arc faults is made possible.

In one advantageous configuration of an embodiment of the invention, the arc fault detection unit is configured in such a way that the voltage values are determined at a multiple of the frequency of the low-voltage circuit or at a sampling frequency in the range of 2-100 kHz, in particular in the range of 10 to 40 or 60 kHz, more specifically at 40-50 kHz.

This has the particular advantage that an optimum number of voltage values are present for the evaluation according to an embodiment of the invention. Given a grid frequency of the low-voltage circuit of 50 or 60 Hz, approximately 1000 voltage values are thus present per fundamental wave of the grid frequency. At this number, good detection of arc faults has been shown by way of an embodiment of the invention.

In one advantageous configuration of an embodiment of the invention, in which partial sums are determined, the evaluation unit is configured in such a way that the first number is identified by a time window. That is to say the number of current values to be summed is identified by a time window to be used. The first number of voltage values, due to the sampling frequency used, also results from the time window, which may lie, for example, in a range of between 0.1 and 5 ms or 10 ms, in particular may lie at 1 ms.

This has the particular advantage that the evaluation takes place progressively and a particularly accurate detection of arc faults is thus made possible.

In one advantageous configuration of an embodiment of the invention, in which partial sums are determined, the evaluation unit is configured in such a way that a difference is determined for each determined voltage value (u(k)). That is to say the difference determination according to the invention is carried out continuously for each new voltage value.

This has the particular advantage that a particularly prompt and rapid determination of arc faults is made possible.

In one advantageous configuration of an embodiment of the invention, in which partial sums are determined, the evaluation unit is configured in such a way that the difference (DU) is multiplied by a factor whose magnitude is dependent on the first number. In particular, the factor is a product of a constant and the reciprocal of the first number.

This has the particular advantage that a standardized difference (DU) is available, which is compared with a standardized first threshold value. An evaluation with an objective comparison is therefore made possible.

In one advantageous configuration of an embodiment of the invention, in which partial sums are determined, the evaluation unit is configured in such a way that a second number of differences (DU) is continuously summed to form a difference sum (DS), the difference sum (DS) instead of the difference (DU) is compared with the first threshold value (SW1) and, if the first threshold value is exceeded in magnitude, a first arc fault detection signal is output.

This has the particular advantage that an even more accurate determination of arc faults is made possible since the differences that occur in the case of arc faults are summed. A more accurate or greater value is thus available for the threshold value comparison.

In one advantageous configuration of an embodiment of the invention, in which a first value pair of a voltage value and of a current variable is present at a first point in time and a second value pair of a voltage value and of a current variable is present at a second point in time, an arc voltage (Ulb) is calculated from the two value pairs, which arc voltage is compared with a second threshold value (SW2). If the second threshold value is exceeded in magnitude, a second arc fault detection signal is output.

This has the particular advantage that a simple and reliable possibility for arc fault detection is provided.

In one advantageous configuration of an embodiment of the invention, in which an arc voltage is calculated from value pairs, a third value pair of a voltage value (u3) and of a current variable is present at a third point in time.

An arc voltage (Ulb) is calculated from the three value pairs, which arc voltage is compared with the second threshold value (SW2). If the second threshold value is exceeded in magnitude, an arc fault detection signal is output.

This has the particular advantage that a more accurate and even more reliable possibility for arc fault detection is provided.

In one advantageous configuration of an embodiment of the invention, the electric current variable is either an electric current value (im) or a value for the change in the electric current over the time (i'm). This has the particular advantage that only one current variable, either current value or change in the electric current over the time, or the derivation of the current over the time, needs to be determined. For example, a Rogowski coil can advantageously be used to determine the current variable, whereby the change in the current over the time is identified.

In one advantageous configuration of an embodiment of the invention, in the case of the electric current value (im)

being determined, a value for the change in the electric current over the time (i'm), or the first derivation of the current value over the time, is determined therefrom or, in the case of the value for the change in the electric current over the time (i'm) being determined, the electric current value (im) is determined therefrom.

A value pair therefore advantageously has a voltage value (um), a current value (im) and a value for the change in the current over the time (i'm), whereby the arc voltage (Ulb) can be calculated.

In one advantageous configuration of an embodiment of the invention, in which an arc voltage is calculated from value pairs, the evaluation unit is configured in such a way that the calculation of the arc voltage (Ulb) is carried out with the aid of a differential equation or the solution thereof.

This has the particular advantage that a comprehensive calculation possibility taking into account many parameters of a real circuit is available.

In one advantageous configuration of an embodiment of the invention, in which an arc voltage is calculated from value pairs, the first point in time is situated temporally before the second point in time. As an alternative, the second point in time is situated temporally before the third point in time. As an alternative, the first point in time is situated temporally before the second point in time and the second point in time is situated temporally before the third point in time.

This has the particular advantage that a particularly accurate determination of an arc fault voltage is made possible.

In one advantageous configuration of an embodiment of the invention, a value set comprises a plurality of value pairs and an arc voltage is calculated from at least two value sets. The arc voltage is compared with the second threshold value (SW2) and, if the second threshold value is exceeded in magnitude, the second arc fault detection signal is output.

In one advantageous configuration of an embodiment of the invention, the sensors are arranged externally and do not have to be arranged in the housing of the arc fault detection unit. The periodic or continuous determination of value pairs of a voltage value and of a current variable, in particular at a point in time, can take place, for example, by way of sampling of the corresponding values.

This has the particular advantage that a flexible determination of arc faults is provided.

In one advantageous configuration of an embodiment of the invention, the arc voltage is calculated from three value sets.

This has the particular advantage that a particularly accurate determination of the arc voltage is made possible in order thus to detect arc faults more reliably.

In one advantageous configuration of an embodiment of the invention, the evaluation unit is configured in such a way that the calculation of the arc voltage (Ulb) is carried out with the aid of an integral equation or the solution thereof.

This has the particular advantage that a comprehensive calculation possibility taking into account many parameters of a real circuit is available.

In one advantageous configuration of an embodiment of the invention, the evaluation unit is configured in such a way that a value pair is assigned to just one value set.

This has the particular advantage that a particularly accurate calculation is made possible since redundancies of the determined value pairs in different value sets are ruled out.

In one advantageous configuration of an embodiment of the invention, the evaluation unit is configured in such a way that each value set has a fixed number of value pairs.

This has the particular advantage that a simple possibility for cyclical calculation of the arc voltage is provided since the same number of value pairs can be evaluated at each pass.

In one advantageous configuration of an embodiment of the invention, the evaluation unit is evaluated in such a way that the value pairs are continuously assigned to a value set until the fixed number of value pairs is reached and the subsequent value pairs are assigned to the next value set.

This has the particular advantage that both a more accurate and also cyclical determination of the arc voltage is made possible.

In one advantageous configuration of an embodiment of the invention, the evaluation unit is configured in such a way that, for the calculation of the arc voltage (Ulb) from a value set, at least one of the following terms is formed:

a) a time/voltage sum product (us), formed from the time interval (dt) and the sum of the voltage values (um), wherein the sum of the voltage values is formed by half the first voltage value, half the last voltage value and the sum of the other voltage values of the value set;

b) a time/current sum product (is), formed from the time interval (dt) and the sum of the current values, wherein the sum of the current values is formed by half the first current value, half the last current value and the sum of the other current values of the value set;

c) a time/current change value product (i's), formed from the time interval (dt) and the sum of the values for the change in the current over the time, wherein the sum of the values for the change in the current over the time is formed by half the first value, half the last value and the sum of the other values of the value set;

d) a time/sign value product (ss), formed from the time interval (dt) and the sum of the sign values of the current values, wherein a sign value assumes the value plus one in the case of a positive current value, minus one in the case of a negative current value and zero in the case of a current value of zero, wherein the sum of the sign values is formed from half the sign value of the first current value, half the sign value of the last current value and the sum of the sign values of the other current values.

This has the particular advantage that a determination of the arc fault voltage is made possible by way of at least one of these terms.

In one advantageous configuration of an embodiment of the invention, the evaluation unit is embodied in such a way that a sign value of the current value assumes the value zero if the magnitude of the voltage value of this value pair undershoots a second threshold value. That is to say the result of the sign function or signum function is always set to zero if the magnitude of the simultaneous voltage value is less than or equal to the second threshold value. For example, an anode-cathode voltage drop of approximately 20 V can be assumed as a typical threshold value for this since it can be assumed that an arc cannot occur below this second threshold value.

By introducing this secondary condition for the calculation of the signum function, instabilities in the calculation of the arc voltage are significantly minimized in the case of arc ignition. This has the particular advantage that more accurate calculation results are present, in particular, during and after the arc ignition, and therefore better arc fault detection is made possible.

In one advantageous configuration of an embodiment of the invention, the evaluation unit is configured in such a way that, for the calculation of the arc voltage (Ulb) for two successive value sets, in each case the following terms are formed:
 a first (us1) and a second (us2) time/voltage sum product,
 a first (is1) and a second (is2) time/current sum product,
 a first (i's1) and a second (i's2) time/current change value product,
 a first (ss1) and a second (ss2) time sign value product are calculated.

This has the particular advantage that a simple, in particular integrating, determination of the arc fault voltage is made possible.

In one advantageous configuration of an embodiment of the invention, the evaluation unit is configured in such a way that, for the calculation of the arc voltage (Ulb) for three successive value sets, in each case the following terms are formed:
 a first (us1), a second (us2) and a third (us3) time/voltage sum product,
 a first (is1), a second (is2) and a third (is3) time/current sum product,
 a first (i's1), a second (i's2) and a third (i's3) time/current change value product,
 a first (ss1), a second (ss2) and a third (ss3) time/sign value product are calculated.

This has the particular advantage that a simple and more accurate, in particular integrating, determination of the arc fault voltage is made possible.

In one advantageous configuration of an embodiment of the invention, the evaluation unit is configured in such a way that, for the calculation of the arc voltage (Ulb), at least one of the following terms is formed:
 a first product (P1), formed from the third time/voltage sum product (us3) and the second time/current sum product (is2),
 a second product (P2), formed from the second time/voltage sum product (us2) and the third time/current sum product (is3),
 a third product (P3), formed from the second time/current change value product (i's2) and the first time/current sum product (is1),
 a fourth product (P4), formed from the first time/current change value product (i's1) and the second time/current sum product (is2),
 a fifth product (P5), formed from the second time/voltage sum product (us2) and the first time/current sum product (is1),
 a sixth product (P6), formed from the first time/voltage sum product (us1) and the second time/current sum product (is2),
 a seventh product (P7), formed from the third time/current change value product (i's3) and the second time/current sum product (is2),
 an eighth product (P8), formed from the second time/current change value product (i's2) and the third time/current sum product (is3),
 a ninth product (P9), formed from the first time/sign value product (ss1) and the second time/current sum product (is2),
 a tenth product (P10), formed from the second time/sign value product (ss2) and the first time/current sum product (is1), an eleventh product (P11), formed from the second time/sign value product (ss2) and the third time/current sum product (is3),
 a twelfth product (P12), formed from the third time/sign value product (ss3) and the second time/current sum product (is2),
 a first difference (D1), the minuend of which is the first product (P1) and the subtrahend of which is the second product (P2),
 a second difference (D2), the minuend of which is the third product (P3) and the subtrahend of which is the fourth product (P4),
 a third difference (D3), the minuend of which is the fifth product (P5) and the subtrahend of which is the sixth product (P6),
 a fourth difference (D4), the minuend of which is the seventh product (P7) and the subtrahend of which is the eighth product (P8),
 a fifth difference (D5), the minuend of which is the ninth product (P9) and the subtrahend of which is the tenth product (P10),
 a sixth difference (D6), the minuend of which is the eleventh product (P11) and the subtrahend of which is the twelfth product (P12),
 a thirteenth product (P13), formed from the first difference (D1) and the second difference (D2),
 a fourteenth product (P14), formed from the third difference (D3) and the fourth difference (D4),
 a fifteenth product (P15), formed from the fifth difference (D5) and the fourth difference (D4),
 a sixteenth product (P16), formed from the sixth difference (D6) and the second difference (D2),
 a seventh difference (D7), the minuend of which is the thirteenth product (P13) and the subtrahend of which is the fourteenth product (P14),
 an eighth difference (D8), the minuend of which is the fifteenth product (P15) and the subtrahend of which is the sixteenth product (P16).

This has the particular advantage that a determination, in particular based on an integrating approach, of the arc fault voltage is made possible by way of at least one of these terms.

In one advantageous configuration of an embodiment of the invention, the evaluation unit is configured in such a way that the arc voltage (Ulb) is a quotient, the dividend of which has terms of the seventh difference (D7) and the divisor of which has terms of the eighth difference (D8).

This has the particular advantage that a very accurate determination of an arc fault voltage is made possible.

In one advantageous configuration of an embodiment of the invention, the evaluation unit is configured in such a way that the arc voltage (Ulb) is set to the value zero if the sum of the first (ss1), second (ss2) and third (ss3) time/sign value product is equal to zero.

This has the particular advantage that unacceptable calculation results during the calculation of the arc voltage are avoided. These results can occur if the three time/sign value products (ss1, ss2, ss3) are each zero. In this case, the arc voltage is set to the value zero.

According to an embodiment of the invention, a circuit breaker for an electrical circuit, in particular a low-voltage circuit, is also provided. The circuit breaker has an arc fault detection unit according to an embodiment of the invention. The arc fault detection unit is connected to the circuit breaker, wherein these are configured in such a way that, when an arc fault detection signal is output, the circuit breaker trips, that is to say interrupts the electrical circuit. An extinguishing of the arc fault can therefore be achieved. If the circuit breaker has an electronic trip unit, a very rapid tripping of the circuit breaker can be achieved when an arc fault detection signal is present.

This has the particular advantage that a circuit breaker is expanded by a further, advantageous functionality for the protection of electrical systems. Arc faults are thereby advantageously detected and disconnected in one device. If applicable, available assemblies, such as voltage and/or current sensors, power infeed units, microprocessors for the evaluation unit etc. can also be used and can thus achieve synergies.

According to an embodiment of the invention, a short-circuiting device, having an arc fault detection unit, which is connected to the short-circuiting device, is provided. These are configured in such a way that, when an arc fault detection signal is output, the short-circuiting device short-circuits the electrical circuit in order to cause extinguishing of the arc fault.

This has the particular advantage that a simple, rapid and effective possibility for extinguishing arc faults is available.

According to an embodiment of the invention, a method for arc fault detection for an electrical circuit is also provided, in which method electrical voltage values and current variables of the electrical circuit are determined periodically, the electrical voltage values are fed to a first arc fault detection function, which carries out a first arc fault detection on the basis of the signal profile of the voltage and, if a first threshold value (SW1) is exceeded in magnitude, outputs a first arc fault detection signal. The electrical voltage values and current variables are also fed to a second arc fault detection function, which carries out a second arc fault detection on the basis of the voltage values and current variables and, if a second threshold value (SW2) is exceeded in magnitude, outputs a second arc fault detection signal. The two arc fault detection signals are fed to an OR function so that, in the presence of a first or second arc fault detection signal, an OR-linked arc fault detection signal is output as an output-side arc fault detection signal.

This has the particular advantage of a simple method for arc fault detection.

All of the configurations and features of embodiments of the invention bring about an improvement of the detection of arc faults and the extinguishing thereof.

In a circuit or power infeed system, in which an arc fault burns, a current and voltage profile, which has a significant profile, can be measured. A typical voltage and current profile for an arc fault is illustrated in FIG. 1. The figure shows an illustration of a graph, in which the time profile of the electrical voltage U and of the electric current I after ignition of an arc or arc fault, in particular parallel arc fault, is illustrated in an electrical circuit, in particular low-voltage circuit.

The time t is illustrated on the horizontal X-axis in milliseconds (ms). The magnitude of the electrical voltage U is illustrated on the vertical Y-axis on the left scale in volts (V). On the right scale, the magnitude of the electrical current I is illustrated in amps (A).

After the arc ignition, the current I is approximately sinusoidal. The voltage U is severely distorted, approximately "sawtooth-shaped", with rapid voltage changes. Roughly interpreted, to a first approximation, the voltage profile is square-wave, instead of a conventional sinusoidal profile. Considered in the abstract, a square wave can be identified in the voltage profile, which exhibits a highly stochastic component on the plateau. The square-wave shape is characterized by the fact that, during the arc ignition and in the subsequent voltage zero crossings of the AC voltage, significantly increased voltage changes occur, which are designated hereafter by the term voltage jump, since the rise of the voltage change is substantially greater in comparison to a sinusoidal voltage profile.

In contrast to the voltage profile, the current profile of an arc fault has a virtually sinusoidal profile. At the point in time at which the arc ignites, however, there is a reduction in the current rise that is due to the physical, current-limiting effect of arcs. In addition, a significant change in the rise of the current profile occurs at each further current zero crossing after arc ignition.

According to an embodiment of the invention, such voltage changes or voltage jumps should be used for arc fault detection. Furthermore, the arc voltage should be calculated. The detection should be carried out here in accordance with an embodiment of the invention by way of at least the two different determinations methods.

To this end, voltage values and current variables of an electrical circuit are determined, identified, sampled and measured periodically, for example at a fixed sampling time or sampling frequency fa. In this case, the sampling frequency or measuring frequency should be a multiple of the frequency of the measured AC variables. For example, in the case of conventional power grids at, for example, 50 Hz or 60 Hz grid frequency, the measuring frequency could be in the kilohertz range, for example between 1 and 200 kHz, more specifically in the range of between 10 and 40 or 60 kHz, in particular at 40-50 kHz.

The electrical voltage values and electric current values are determined continuously or periodically, for example by way of one sensor each. For example, the electric current can in this case be measured directly. As an alternative, the change in the current over the time can also be measured. In the case of the electric current im being measured, the change in the current over the time i'm can be determined therefrom, for example by way of differentiation of the current value im. In the case of the change in the electric current over the time i'm being measured, the electric current im can be determined therefrom, for example by way of integration of the change in the electric current over the time i'm. The measurement of the change in the electric current over the time i'm can take place, for example, by way of a Rogowski coil. In the case of sinusoidal flows in the circuit, the integration can be realized particularly easily since the integral of sine is cosine and the integral of cosine is sine.

The current value im and the change in the current over the time i'm can likewise also be measured in parallel, for example by way of 2 sensors. A conversion is thus not necessary.

voltage values um and current values im or voltage values um and values for the change in the electric current over the time i'm, are determined again and again with a time interval, for example a fixed time interval dt (sampling frequency).

In this case, a voltage value and a current variable are each determined, for example, at an, in particular identical, point in time.

For the first arc fault function, a difference calculation can be carried out, for example, by way of two continuously determined voltage values (um, um−1), wherein a difference quotient (Dqun) is calculated for each sampling value of the voltage (um). To this end, the voltage difference between the present voltage sampling value (um) and the preceding voltage sampling value (um−1) is formed. The voltage difference (dun) is divided by the time difference (dt), that is to say dt=tn−tn−1, of the voltage sampling values (um, um−1) in order to thus obtain the difference quotient (Dqun) as per formula 1.

$$Dqun = \frac{u_m - u_{m-1}}{t_n - t_{n-1}} = \frac{du_n}{dt}$$

The difference quotient (Dqun) is compared, as measure for the change in the voltage over the time, with a fourth threshold value (SW4) instead of the first threshold value. When the threshold condition has been met, a first arc fault detection signal is output.

As an alternative, the present voltage sample (um) can also be drawn from the preceding voltage sampling value (um-1) (dun=(um-1)−(um)). As a result, only the sign of the difference quotient changes. In the case of a comparison in which it is not the magnitude that is compared with the threshold value but the absolute values, the sign of the threshold value also has to be noted and adapted accordingly.

For example, the voltage values 30 volts (um-1) and 50 volts (um) have been measured at the time interval of 20 μs, which corresponds to a sampling frequency of 50 kHz.

$$Dqun = \frac{50\ \text{Volt} - 30\ \text{Volt}}{20\ \mu s} = 1\frac{V}{\mu s}$$

The first threshold value could be, for example, 0.5 V/μs.

The determined difference quotient 1 V/μs is above 0.5 V/μs. A first arc fault detection signal is therefore output.

Figure 3:
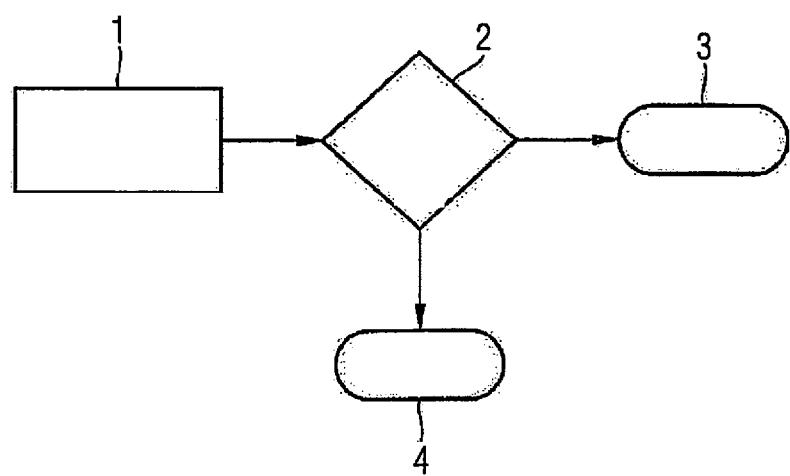
FIG. 3 shows a first flow chart for arc fault detection

A corresponding evaluation is illustrated in FIG. 3. According to FIG. 3, the difference quotient voltage (Dqun) is continuously calculated in a first step (1). The difference quotient is compared with the fourth threshold value (SW4) in a second step (2). If the fourth threshold value (SW4) is exceeded in magnitude, a first arc fault detection signal is output in a third step (3). If the fourth threshold value (SW4) is not exceeded, it can be reported that there is no arc fault or no burning arc fault present in a fourth step (4).

The calculation can be carried out continuously.

As an alternative, the first arc fault function can also be carried out by way of a partial sum calculation. According to an embodiment of the invention, the voltage jump in the case of the arc ignition and at each voltage zero crossing following same should be detected in order to detect an arc fault. A significant advantage in the extraction of this signal property in the voltage profile is the period occurrence. Additional detection reliability can therefore be achieved when, intentionally or unintentionally, the first occurrence of the signal property in the case of arc ignition does not lead to detection of the arc fault.

For the extraction of the signal property, according to the invention, a summation by way of difference calculation should be used, which is intended to be referred to as W-RU and in one configuration as W-RUs method.

The evaluation takes place to the effect that a difference or a voltage jump DU is introduced. This is determined as follows, wherein the voltage values um or um are also characterized in the following text as u(k) and u(n) depending on the point in time:

wherein:
u(k)=voltage value at (recent) point in time k
u(n)=voltage value at present point in time n
DU(n)=difference at the present point in time n
J=first number, that is to say number of points in time or sampling values used for the calculation of the difference.

The difference DU(n) is determined for a presently measured voltage value u(n) by way of the above formula. The first number j, which may be, for example, a fixed number, serves as the basis for the calculation. For example, a fixed number j of sampling values is used for each calculation. For example, j may be in a range of between 10 and 100, in particular in the range 40-50.

The calculation is intended to be illustrated for the case j=40. To this end, use is made of the presently measured voltage value u(n) and the respective recent or previous 39 voltage values situated before it
u(n−1) to u(n−(40−1)), that is to say
u(n−1) to u(n−40+1), that is to say
u(n−1) to u(39).

In sum, (j=)40 voltage values.

For the first partial sum (TS1), the voltage values u(k) for k=n−(j−1)=n−(40−1)=n−39 to k=n−j/2=n−40/2=n−20 are summed, that is to say from the recent (older) 39th voltage value to the recent (younger) 20th voltage value, in sum 20 values.

As the second partial sum (TS2), the voltage values u(k) for k=n−(j/2−1)=n−(40/2−1)=n−19 to k=n are summed, that is to say from the recent 19th voltage value to the present voltage value u(n), in sum likewise 20 values.

The difference DU of both partial sums is compared in magnitude with a first threshold value SW1 dependent on the number j. If the first threshold value is exceeded, a first arc fault detection signal is output.

In this case, the respective halves of the first number j are summed. A half in the context of the invention also means a half value deviating by a value. That is to say, according to a first variant, in the first partial sum 19 values and in the second partial sum 21 values could be summed, wherein j has the value 40.

In a second variant, an uneven first number j means an asymmetrical division. That is to say in a first partial sum, for example, 19 values can be summed and in the second partial sum 20 values can be summed, wherein j would have the value 39 in this case.

Average values can also be used as partial sums, which average values are determined from the respective voltage values, for example by way of partial sums. That is to say an average value could be formed from a significantly deviating number of voltage values, for example for each partial sum.

As an alternative, both partial sums and the difference can be multiplied by a factor containing, for example, the reciprocal of the first number j, that is to say, for example, with 1/j or 2/j.

$$DU(n) = \sum_{k=n-(j-1)}^{k=n-\frac{j}{2}} u(k) - \sum_{k=n-(\frac{j}{2}-1)}^{k=n} u(k) \quad (1)$$

$$DU(n) = \frac{2}{j}\left[\sum_{k=n-j+1}^{k=n-\frac{j}{2}} u(k) - \sum_{k=n-\frac{j}{2}+1}^{k=n} u(k)\right] \quad (2)$$

As a result, a comparison of magnitude with a first threshold value SW1 independent of the number of sampling values used, that is to say of the first number, is possible since the difference corresponds in standardized fashion to the voltage used in the circuit, that is to say corresponds to the equivalent voltage jump taking place. The value of the difference is therefore no longer dependent on the number of summations but on the voltage used.

According to the first or second variant, the half can be divided into a first partial sum number g and h, wherein j=g+h and g≠h.

$$DU(n) = \frac{1}{g}\Sigma_{k=n-(g+h)+1}^{k=n-h}u(k) - \frac{1}{h}\Sigma_{k=n-h+1}^{k=n}u(k) \quad (3)$$

The first number j or number of sampling values used j determines the time frame used over the sampling frequency used.

Conversely, in the case of a prescribed sampling frequency and time window to be monitored, the first number to be used can be determined.

The three variables of time window ta, sampling frequency fa and number of sampling values (=first number) j can each be expressed in terms of each other, j=ta·fa.

Given a grid frequency of the low-voltage circuit of 50-60 Hz, a sampling frequency of 1 to 200 kHz, in particular 1 to 60 kHz, more specifically 40-50 kHz, and a time window or a dilation time of 0.1 ms to 5 ms or 10 ms, in particular of approximately 1 ms, have been shown to provide a reliable detection of arc faults. For the first number j of the required sampling values or sampling points, this therefore gives j=40-50.

Dilation time means the length of the time window over which the partial sums or the equivalent voltage jump is/are calculated.

The two partial sums TS1 and TS2 can also be interchanged. That is to say the first partial sum is deducted from the second partial sum. This merely changes the sign. In the same way, for example, in the case of AC grids after an edge change, that is to say when a change is made from a rising edge to a falling edge of the typically sinusoidal AC voltages, a sign change can also occur.

In sinusoidal voltages, a rising edge occurs usually in the range from 0° to 90° and 270° to 360°; a falling edge typically occurs in the range from 90° to 270°.

If the difference DU is exceeded in magnitude, a first arc fault detection signal is output.

For an output of a second arc fault detection signal, an evaluation in the same way as described previously as per FIG. 3 can take place. In a first step 1, the difference DU is calculated continuously according to an embodiment of the invention.

In a second step 2, the difference is compared in magnitude with the first threshold value SW1.

If the first threshold value SW1 is exceeded, a first arc fault detection signal is output in a third step 3.

If the first threshold value SW1 is not exceeded, it can be reported that there is no arc fault present in a fourth step 4.

For example, in the case of a standardized calculation, the first threshold value SW1 can be in the range of 8 volts to 300 volts, in particular 10 to 30 or 100 volts, more specifically in the range of 15 to 20 or 25 volts, wherein reference is made to the fact that the calculated difference DU or equivalent voltage jump is below the real voltage jump that can be detected in the voltage profile.

A further improvement can be achieved by way of a further summation of the differences DU to form a difference sum DS. This is referred to in the following text as W-RUs method. In the case of arc faults that do not generate a high voltage jump, a more rapid detection can be achieved.

In the W-RUs method, individual differences or voltage jumps that occur, in particular, in the case of arc ignition as a result of a plurality of small arcs igniting successively are added.

The determined differences DU are summed with a second number z, which may be in the range of the first number j or else may be greater or lower, to form a difference sum DS. For example, the second number z may have one to four to six times the value of j.

$$DS(n)=\Sigma_{k=n-z}^{k=n}DU(k) \quad (4)$$

Z=second number, that is to say number of differences DU used for the calculation of the difference sum
DS(n)=difference sum based on the present value n The second number z can in this case be determined again over the sampling frequency fa and the time window ts to be observed for the summation, z=ts·fa.

It has been shown that, when using the summation, the first time window or the first dilation time ta can or should be selected to be smaller to calculate the individual voltage jump. The time ta could in this case be approximately 0.05 to 1 ms, in particular 0.2 ms.

Furthermore, it has been found to be advantageous when the differences used for the summation are not used a second time, for the subsequent summation.

For a simple, program-related implementation of the algorithm, a relative equivalent voltage jump or sampling difference DA(n) can be calculated for each voltage value u(n) or sampling value per voltage value u(n) based on the first number j or variable of the dilation parameter as follows:

$$DA(n) = \frac{DU(n)}{j} \quad (5)$$

That is to say the difference DU is divided by the first number j in order to obtain the sampling difference for a voltage value u(n). The calculated sampling difference DA(n) describes the relative equivalent voltage jump per voltage value u(n) or sampling value.

For example, a first voltage value u(1) of 36 volts, a subsequent second voltage value u(2) of 40 volts, a subsequent third voltage value u(3) of 50 volts, a subsequent fourth voltage value u(4) of 60 volts, a subsequent fifth voltage value u(5) of 70 volts, a subsequent sixth voltage value u(6) of 72 volts and a subsequent seventh voltage value u(7) of 74 volts are measured.

The first number j has a value of 4, for example.

As per formula 2, the first partial sum is 76 volts, the second partial sum is 110 volts. The pure difference of the partial sums is 34 volts, multiplied by 2/j, that is to say 2/4, the difference DU(4) is 17 volts. That is to say the difference corresponds to an average voltage jump across the 4 voltage values of 17 volts.

Based on the first four voltage values u(1), ..., u(4) or sampling values, the sampling difference DA(4): 17 volts divided by 4 equals 4.25 volts (that is to say the relative voltage jump per voltage value).

Based on the next four voltage values u(2), ..., u(5), the difference of the partial sums is 130 volts−90 volts=40 volts.

The difference DU(5) is then 20 volts again. The sampling difference DA(5) is 5 volts (that is to say the relative voltage jump per voltage value).

Based on the next four voltage values u(3), ..., u (6), the difference of the partial sums is 142 volts−110 volts=32 volts; the difference DU(6) is then 16 volts, the sampling difference DA(6) is 4 volts (that is to say the relative voltage jump per voltage value).

Based on the next four voltage values u(4), ..., u (7), the difference of the partial sums is 146 volts−130 volts=16 volts; the difference DU(7) is then 8 volts, the sampling difference DA(7) is 2 volts (that is to say the relative voltage jump per voltage value).

In one configuration of an embodiment of the invention, the respective maximum value is now intended to be summed for each (continuously) calculated sampling difference DA(n).

To this end, the sampling difference DA(n) is assigned to each of the j voltage values that have been used for the calculation of the difference and sampling difference; see the following table.

| n | U (n) | DA (1) | DA (2) | DA (3) | DA (4) | DA (5) | DA (6) | DA (7) | DAmax (n) |
|---|-------|--------|--------|--------|--------|--------|--------|--------|-----------|
| 1 | 36 V | 4.5 V (0 V) | 9.5 V (0 V) | 6.75 V (0 V) | 4.25 V | | | | 4.25 V |
| 2 | 40 V | | 9.5 V (0 V) | 6.75 V (0 V) | 4.25 V | 5 V | | | 5 V |
| 3 | 50 V | | | 6.75 V (0 V) | 4.25 V | 5 V | 4 V | | 5 V |
| 4 | 60 V | | | | 4.25 V | 5 V | 4 V | 2 V [0 V] | 5 V |
| 5 | 70 V | | | | | 5 V | 4 V | 2 V [0 V] | 5 V |
| 6 | 72 V | | | | | | 4 V | 2 V [0 V] | 4 V |
| 7 | 74 V | | | | | | | 2 V [0 V] | 2 V [0 V] |

If the first number j of voltage values u(n), u(k) are not yet present for calculation, the differences or sampling differences can be set to zero; see the values of 0 volts indicated in parentheses in columns DA(1), DA(2), DA(3).

The respective maximum sampling difference DAmax(n) is determined from the sampling differences assigned to j per voltage value U(n). In this case, only less than j sampling differences DA are present of course for the just recent sampling differences DA(n), wherein the present or maximum sampling difference DA of the present sampling differences is then used The maximum sampling differences DAmax per voltage value U(n) are summed to form a sum of the maximum sampling differences SMA, and specifically in each case a second number z of maximum sampling differences SMA.

$$SMA(n) = \Sigma_{k=n-z}^{k=n} DA\,max(k) \quad (6)$$

If the second number z has, for example, a value of z=6, a sum of the maximum sampling differences for the first 6 maximum sampling differences of SMA(6)=28.25 volts.

The sum of the maximum sampling differences SMA or the magnitude thereof is compared with the first threshold value SW1 and, if the first threshold value is exceed in magnitude, a first arc fault detection signal SLES is output.

This has the advantage that a plurality of subsequently occurring voltage jumps are summed and the sum thereof is used for the evaluation of the presence of an arc fault.

In one configuration of an embodiment of the invention, a further threshold value comparison can be provided to the effect that, for the calculation of the sampling difference DA(n), the value of DU(n) is set to zero when the magnitude thereof undershoots a fifth threshold value SW5.

For a low-voltage grid, the fifth threshold value SW5 can be in the range of 8 volts to 50 volts, in particular 10 to 30, more specifically in the range 10 to 20 or 25 volts.

It can also be identical to the magnitude of the first threshold value or in the order of magnitude thereof.

This has the advantage that the typical—usually sinusoidal—voltage profile is not taken into account or is taken into account to a lesser extent.

For example, the seventh difference DU(7), which has the value of 8 volts, could, by way of example, be below the fifth threshold value SW5 in magnitude, which fifth threshold value has a magnitude of 10 volts, for example. The seventh sampling difference DA(7) would thus have the value of 0 volts. This is illustrated, in particular, in column DA(7) by way of values of 0 volts in square parentheses.

Figure 2:
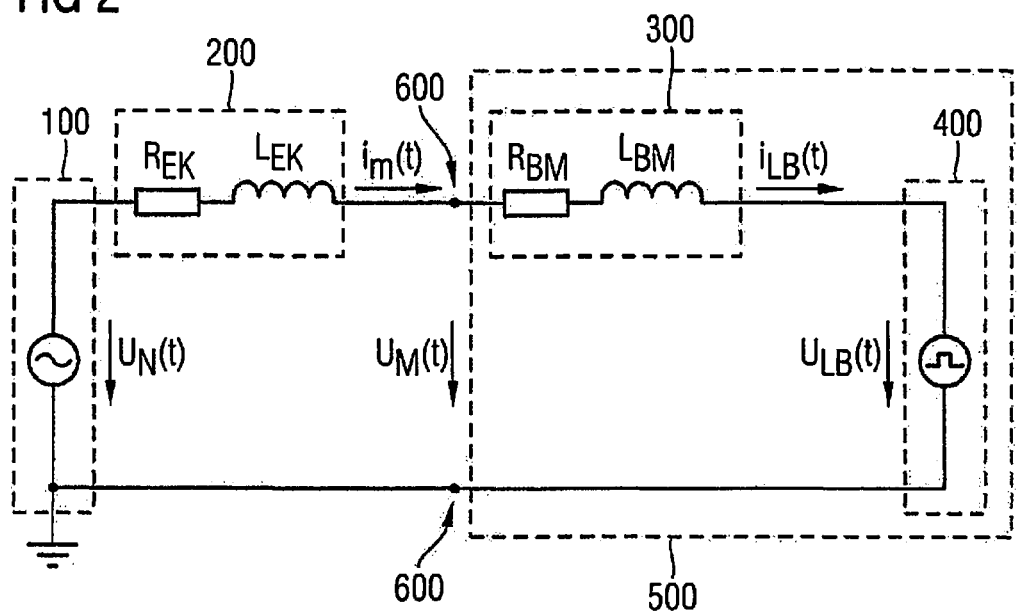
FIG. 2 shows an equivalent circuit diagram of an electrical circuit

FIG. 2 shows an equivalent circuit diagram of an electrical circuit, having an electrical energy source 100, which provides an electrical grid voltage un(t), a grid access point connected thereto or an infeed cable 200, illustrated by electrical equivalent circuit elements, such as an infeed cable resistor Rek and an infeed cable inductance or coil Lek, which is followed by an electrical load, operating device(s) or energy sink 300, illustrated in turn by electrical equivalent circuit elements, such as a load resistor RBM and a load inductance or coil LBM. An electrical voltage um(t) and an electric current variable, such as the electric current value im(t) and/or the change in the current over the time i'm(t), or the first derivation of the current over the time, respectively, can be measured between the infeed cable 200 and the load 300.

These variables, in particular the electrical voltage or electrical voltage values, are captured at the measuring points 600 in order to be further processed in the arc fault detection unit.

The area monitored with respect to arc faults is illustrated by a dashed line 500.

An arc fault, which is illustrated by an arc 400 with an arc voltage Ulb(t), can arise in the electrical circuit. According to the invention, an arc voltage Ulb is calculated continuously in the arc fault detection unit for the second arc fault detection function with the aid of the measured/sampled voltage um(t) and the measured/sampled current variable (current and/or current change).

According to an embodiment of the invention, the voltage, the current and the change in the current over the time are used for the calculation. For this purpose, such a value pair is assigned to at least one value set. In one preferred embodiment, a value pair is assigned to precisely one value set. It is essential that a value set contains at least one value pair that is not contained in the preceding or following value set.

According to an embodiment of the invention, an arc voltage is calculated from at least two value sets.

In one preferred configuration, a fixed number of value pairs, which are determined, for example, in chronological succession, for example at a fixed time interval, are assigned to a value set. For example, a value set contains 10 value pairs. The first 10 value pairs are assigned to the first value set. The second 10 value pairs are assigned to the second value set, and the third 10 value pairs are assigned to the third value set etc.

In each case, at least 2 value sets are used for the determination of an arc voltage or of an arc fault. The calculation is carried out continuously, that is to say, for example, a first calculation with the value sets 1 and 2 or 1 to 3, and a second calculation according to the invention with the value sets 2 and 3 or 2 to 4 etc. (the first statement is for calculation with 2 value sets and the second statement is for calculation with 3 value sets). 1st example:

For example, value pairs of 1 to x (x≥32; x∈☐) are sampled and a value set is composed of 10 value pairs. In each case, 3 value sets are used for the determination of an arc voltage or of an arc fault.

The value pairs 1-10 are assigned to the value set 1.
The value pairs 11-20 are assigned to the value set 2.
The value pairs 21-30 are assigned to the value set 3.

The calculation is carried out continuously, that is to say, for example, the first calculation according to an embodiment of the invention with the value pairs 1 to 30, the second calculation according to the invention with the value pairs 2 to 31, the third calculation according to the invention with the value pairs 3 to 32 etc. Therefore, a calculation result for the subsequent evaluation is available at each sampling point.

2nd Example

Value sets can also be superimposed on one another for the calculation. That is to say two value sets can use one or more identical value pairs. In this context, the principle that each value set must contain at least one further value pair that is not used in the other value sets applies. For example, value pairs of 1 to x (x≥14; x∈☐) are sampled and a value set is composed of 10 value pairs. In each case, 3 value sets are used for the determination of an arc voltage or of an arc fault.

The value pairs 1-10 are assigned to the value set 1.
The value pairs 2-11 are assigned to the value set 2.
The value pairs 3-12 are assigned to the value set 3.

The calculation is carried out continuously, that is to say, for example, a first calculation according to an embodiment of the invention with the value pairs 1 to 12, a second calculation according to an embodiment of the invention with the value pairs 2 to 13, a third calculation according to an embodiment of the invention with the value pairs 3 to 14 etc. Therefore, a calculation result for the subsequent evaluation is available at each sampling point. 3rd example:

For the calculation, the value sets can also have a different magnitude. For example, value pairs of 1 to x (x≥17; x∈☐) are sampled. In each case, 3 value sets are used for the determination of an arc voltage or of an arc fault, wherein the 1st value set is composed of 6 value pairs, the 2nd value set is composed of 15 value pairs and the 3rd value set is composed of 9 value pairs.

The value pairs 1-6 are assigned to the value set 1.
The value pairs 1-15 are assigned to the value set 2.
The value pairs 6-15 are assigned to the value set 3.

The calculation is carried out continuously, that is to say, for example, a first calculation according to an embodiment of the invention with the value pairs 1 to 15; the three value sets are contained therein. The second calculation according to an embodiment of the invention with the value pairs 2 to 16 and third calculation according to an embodiment of the invention with the value pairs 3 to 17 etc. Therefore, a calculation result for the subsequent evaluation is available at each sampling point.

For example, the value pairs can subsequently also be arranged in succession and be at an interval of a specific number of value pairs from one another.

The calculation is carried out in that certain terms (mathematical expressions or equations) are calculated continuously.

The calculation of these terms is based on a solution of the line equation of the first order:

$$u_m(t) = R_{BM} \cdot i_m(t) + L_{BM} \frac{di_m(t)}{dt} \tag{1}$$

Under the assumption that an arc fault is present in the low-voltage grid, the electrical response would be comparable to that of a counter-voltage source in the grid.

The following, expanded ansatz differential equation results from this:

$$u_m(t) = R_{BM} \cdot i_m(t) + L_{BM} \frac{di_m(t)}{dt} + u_{LB}(t) \tag{2}$$

The arc fault is illustrated in a simplified manner as a purely ohmic load. It is therefore assumed that the arc voltage is in phase with the arc current. The arc voltage can therefore be described by way of the following equation:

$$u_{LD} = U_{LD} \cdot \text{sign}(i_{LD}(t)) \tag{3}$$

If it is assumed that the measuring current $i_m(t)$ corresponds to the arc fault current $i_{LD}(t)$, that is to say that no current branching is present between the measuring location and the arc fault burning location, the following can be stated:

$$u_m(t) = R_{BM} \cdot i_m(t) + L_{BM} \frac{di_m(t)}{dt} + \text{sign}(i_m(t)) \cdot U_{LB} \tag{4}$$

To solve this expanded ansatz differential equation, an integrating solution method is used according to an embodiment of the invention. This results in a complete integrating ansatz:

$$\int u_m(t)dt = R_{BM} \int i_m(t)dt + L_{BM} \int \frac{di_m(t)}{dt}dt + U_{LB} \int \text{sign}(i_m(t))dt \tag{5}$$

The calculation of the arc voltage is carried out by transposing and resolving equation (5) according to ULB.

The following ansatz equation is used for the calculation:

$$\int u_m(t)dt - R_{BM} \int i_m(t)dt + L_{BM} \int \frac{di_m(t)}{dt}dt + U_{LB} \int \text{sign}(i_m(t))dt = \tag{6}$$
$$R_{BM} \int i_m(t)dt + L_{BM} \int i'_m(t)dt + U_{LB} \int \text{sign}(i_m(t))dt$$

For example, the trapezoidal rule method according to equation (7) is used for the numerical integration.

$$\int_{t_A}^{t_E} f(t)dt \approx \frac{\Delta t}{2}\left[f(t_A) + 2\sum_{v=1}^{\frac{t_E-t_A}{\Delta t}-1} f(t_A + v \cdot \Delta t) + f(t_E)\right] \tag{7}$$

For a simplified presentation of the solution, the integration intervals that are solved with trapezoidal rules are substituted by the following terms:

$$u_s = \frac{\Delta t}{2}\left[u_m(t_A) + 2\sum_{v=1}^{\frac{t_E-t_A}{\Delta t}-1} u_m(t_A + v \cdot \Delta t) + u_m(t_E)\right] \quad (8)$$

$$i_s = \frac{\Delta t}{2}\left[i_m(t_A) + 2\sum_{v=1}^{\frac{t_E-t_A}{\Delta t}-1} i_m(t_A + v \cdot \Delta t) + i_m(t_E)\right] \quad (9)$$

$$i'_s = \frac{\Delta t}{2}\left[i'_m(t_A) + 2\sum_{v=1}^{\frac{t_E-t_A}{\Delta t}-1} i'_m(t_A + v \cdot \Delta t) + i'_m(t_E)\right] \quad (10)$$

$$s_s = \frac{\Delta t}{2}\left[\text{sign}(i_m(t_A)) + 2\sum_{v=1}^{\frac{t_E-t_A}{\Delta t}-1} \text{sign}(i_m(t_A + v \cdot \Delta t)) + i_m(t_E)\right] \quad (11)$$

$$t_s = \frac{t_E - t_A}{\Delta t}$$

The value ts is in this case the number of value pairs per value set, $\Delta t$ corresponds to the reference sign dt, which corresponds to the time interval between the sampled voltage values or current variables, or value pairs.

The variable tE corresponds to the time of the chronologically last value pair of a value set, tA corresponds to the time of the chronologically first value pair of the value set.

The following terms are respectively calculated for a value set with the formulae 8 to 11:

(8) a time/voltage sum product (uS), formed from the time interval (dt) and the sum of the voltage values (um), wherein the sum of the voltage values is formed by half the first voltage value, half the last voltage value and the sum of the other voltage values of the value set.

(9) a time/current sum product (is), formed from the time interval (dt) and the sum of the current values, wherein the sum of the current values is formed by half the first current value, half the last current value and the sum of the other current values of the value set.

(10) a time/current change value product (i's), formed from the time interval (dt) and the sum of the values for the change in the current over the time, wherein the sum of the values for the change in the current over the time is formed by half the first value, half the last value and the sum of the other values of the value set.

(11) a time/sign value product (ss), formed from the time interval (dt) and the sum of the sign values of the current values, wherein a sign value assumes the value plus one in the case of a positive current value, minus one in the case of a negative current value and zero in the case of a current value of zero, wherein the sum of the sign values is formed from half the sign value of the first current value, half the sign value of the last current value and the sum of the sign values of the other current values.

The equation system corresponding to ansatz equation 5 is obtained with the substituted terms as:

$$u_s = R_{BM}i_s - L_{BM}i'_s + U_{LB}s_s \quad (13)$$

The equation system contains the three unknown variables RBM, LBM, and ULB. For the solution thereof, (at least) two integration limits that are chronologically different from one another are used and three for a very accurate determination, for example by using according to the invention two or three value sets:

$$u_{s1} = R_{BM}i_{s1} + L_{BM}i'_{s1} + U_{LB}s_{s1}$$

$$u_{s2} = R_{BM}i_{s2} + L_{BM}i'_{s2} + U_{LB}s_{s2}$$

$$u_{s3} = R_{BM}i_{s3} + L_{BM}i'_{s3} + U_{LB}s_{s3} \quad (14)$$

The arc voltage ULB can consequently be calculated according to an embodiment of the invention, for example, with the following formula.

$$U_{LB} = \frac{(u_{s3}i_{s2} - u_{s2}i_{s3})(i'_{s2}i_{s1} - i'_{s1}i_{s2}) -}{(u_{s2}i_{s1} - u_{s1}i_{s2})(i'_{s3}i_{s2} - i'_{s2}i_{s3})} \quad (15)$$
$$\frac{(s_{s1}i_{s2} - s_{s2}i_{s1})(i'_{s3}i_{s2} - i'_{s2}i_{s3}) -}{(s_{s2}i_{s3} - s_{s3}i_{s2})(i'_{s2}i_{s1} - i'_{s1}i_{s2})}$$

wherein us, is, i's, ss are the time/voltage sum products, time/current sum products, time/current change value products, time/sign value products, according to formulae 8 to 11, of a first, second and a third value set, according to the index.

The abbreviation sign or sgn represents the signum function or sign function. This function assigns a number its sign. This is defined as follows:

sign(x)=+1, if x>0;

sign(x)=0, if x=0;

sign(x)=−1, if x<0.

Formula 14 is composed of 12 products P1, . . . , P12 which contain:
a) products of time/voltage sum products us and time/current sum products is,
b) products of time/current sum products is and time/current change value products i's,
c) products of time/sign value products ss and time/current sum products is.

$$U_{LB} = \frac{(P1 - P2)(P3 - P4) - (P5 - P6)(P7 - P8)}{(P9 - P10)(P7 - P8) - (P11 - P12)(P3 - P4)} \quad (15)$$

$$U_{LB} = \frac{D1 * D2 - D3 * D4}{D5 * D4 - D6 * D2} \quad (16)$$

$$U_{LB} = \frac{P13 - P14}{P15 - P16} \quad (17)$$

$$U_{LB} = \frac{D7}{D8} \quad (18)$$

The 12 products form 6 various differences D1, . . . , D6. The 6 differences D1, . . . , D6 in turn form 4 superordinate products P13, . . . , P16. These in turn form 2 superordinate differences D7, D8, which can be used to determine an arc voltage. If the latter exceeds the second threshold value SW2 in magnitude, the second arc fault detection signal is output.

The arc voltage can also be calculated, for example, with the following simplified formulae, which are likewise solutions of the integral equation. In this context, according to an embodiment of the invention only two value sets are required for the determination.

$$U_{LB} = \frac{u_{s2}i_{s1} - u_{s1}i_{s2}}{t_{s2}i_{s1} - t_{s1}i_{s2}} = \frac{P5 - P6}{P17 - P18} = \frac{D3}{D9}$$

-continued $$U_{LB} = \frac{u_{s2}i_{s1} - u_{s1}i_{s2}}{s_{s2}i_{s1} - s_{s1}i_{s2}} = \frac{P5 - P6}{P10 - P9} = \frac{D3}{D10}$$

$$U_{LB} = \frac{u_{s2}i'_{s1} - u_{s1}i'_{s2}}{t_{s2}i'_{s1} - t_{s1}i'_{s2}} = \frac{P19 - P20}{P21 - P22} = \frac{D11}{D12}$$

$$U_{LB} = \frac{u_{s2}i'_{s1} - u_{s1}i'_{s2}}{s_{s2}i'_{s1} - s_{s1}i'_{s2}} = \frac{P19 - P20}{P23 - P24} = \frac{D11}{D13}$$

A further example calculation using three value sets is given in the following formula.

$$U_{LB} = \frac{(u_{s2}i_{s1} - u_{s1}i_{s2})(i'_{s3}i_{s1} - i'_{s1}i_{s3}) - (u_{s3}i_{s1} - u_{s1}i_{s3})(i'_{s2}i_{s1} - i'_{s1}i_{s2})}{(t_{s1}i_{s3} - t_{s3}i_{s1})(i'_{s2}i_{s1} - i'_{s1}i_{s2}) - (t_{s1}i_{s2} - t_{s2}i_{s1})(i'_{s3}i_{s1} - i'_{s1}i_{s3})}$$

$$U_{LB} = \frac{(P5 - P6)(P25 - P26) - (P27 - P28)(P3 - P4)}{(P29 - P30)(P3 - P4) - (P18 - P17)(P25 - P26)}$$

$$U_{LB} = \frac{D3D14 - D15D2}{D16D2 - D17D14}$$

$$U_{LB} = \frac{P31 - P32}{P33 - P34}$$

$$U_{LB} = \frac{D18}{D19}$$

Each solution of the integral equation, also a simplified one, constitutes an inventive use of an embodiment of the invention.

A distinction can be made in an analogous manner based on FIG. 3.

For example, the second threshold value SW2 or the magnitude thereof can be 30 volts for this case.

In general, the threshold value for a low-voltage grid can be in the range of between 20 and 300 volts, more precisely in the range between 20 and 150 volts, more specifically in the range of between 20 and 70 volts. In particular, values of between 25 and 50 volts appear to be very suitable.

In the calculation of the arc voltage with the evaluation according to an embodiment of the invention, pronounced changes can occur upon the ignition of an arc. For rapid and stable calculation of the arc voltage, it is therefore also possible for improvements to take place in such a way that, for example, the sign or signum function is modified.

In general, the signum function is calculated from the measured current as follows:

$$s(t) = \text{sign}(i_m(t))$$

Stable calculation results are often present only for the time after the arc ignition when the measurement voltage has completely covered the burning arc and is completely contained in the two or three integration intervals or value sets. In the transition region, it is possible for unstable calculation results to occur. If the calculation results are filtered for this region, this results in a slight delay in the detection, but with more reliable determination results. Therefore, according to the invention, a further configuration can be used, in which the signum function is set to the value zero if the determined voltage undershoots a sixth threshold value SW6 such as, for example, a voltage threshold value.

$$s(t) = 0 \| u_m(t) | = U_{1-RLs}{}^s$$

The result of the signum function is, for example, always set to zero if the magnitude of the, for example simultaneous, voltage value of the value pair is less than or equal to the sixth threshold value SW6, such as $U_{1-RLs}{}^s$. In this respect, for example, the anode-cathode voltage drop of approximately 20 V can be assumed to be a typical threshold value, since it can be presumed that an arc cannot occur below this value. The sixth threshold value SW6 or $U_{1-RLs}{}^s$ can assume any value in the range of between 5 and 150 volts, specifically in the range between 10 volts and 50 volts, in particular 15 to 20 volts.

Introducing this secondary condition for the calculation of the signum function minimizes instabilities in the calculation of the arc voltage that possibly occur during the arc ignition.

In order to continue to avoid unacceptable calculation results, according to the invention, the arc voltage can advantageously be set to the value zero if the sum of the two or three integrals sS of the signum function or the sum of the two or three time/sign value products ss yields the value zero.

$$U_{LB} = 0 \ \forall | s_{s1} + s_{s2} | = 0$$

$$U_{LB} = 0 \ \forall | s_{s1} + s_{s2} + s_{s2} | = 0$$

As an alternative, the second arc fault function can also take place by way of value pairs, for example by way of a differential ansatz. According to an embodiment of the invention, the voltage, the current and the change in the current over the time are also used for the calculation here.

According to an embodiment of the invention, at least two value pairs of the variables must be present.

The calculation is carried out in that certain terms (mathematical expressions or equations) are calculated continuously.

The calculation of these terms is also based here on a solution of the line equation of the first order under the assumptions already mentioned.

$$u_m(t) = R_{BM} \cdot i_m(t) + L_{BM} \frac{di_m(t)}{dt}$$

$$u_m(t) = R_{BM} \cdot i_m(t) + L_{BM} \frac{di_m(t)}{dt} + \text{sign}(i_m(t)) \cdot U_{LB}$$

To solve this expanded ansatz differential equation, a differentiating solution method is used according to an embodiment of the invention. The calculation of the arc voltage is carried out according to the invention by transposing and resolving the above equation according to ULB.

$$u_m(t) = R_{BM} \cdot i_m(t) + L_{BM} \cdot \frac{di_m(t)}{dt} + U_{LB} \cdot \text{sgn}(i_m(t))$$

$$= R_{BM} \cdot i_m(t) + L_{BM} \cdot i'_m(t) + U_{LB} \cdot \text{sgn}(i_m(t))$$

A simplification of the equation can be achieved by virtue of individual components or elements of the equation not being taken into account according to the invention, for example, by virtue of only the arc voltage and the ohmic or resistance components being taken into account. As an alternative, for example, only the inductive components, inductive plus sign of the current, ohmic plus sign of the current, ohmic and inductive. In its full form, both the ohmic and inductive components and the sign of the current are taken into account.

Such a simplification has the particular advantage that a particularly simple determination of the arc voltage is made possible thereby and therefore there is a simple possibility for determining an arc fault.

When not all of the components are taken into account, the arc voltage and the corresponding components can be calculated through the inventive use of two different value pairs.

In this case, the arc voltage can be calculated, for example, as follows.

$$U_{LB} = \frac{i_2 \cdot u_1 - i_1 \cdot u_2}{i_2 - i_1} = \frac{PD13 - PD14}{DD9} = \frac{DD10}{DD9}$$

$$U_{LB} = \frac{i_2 \cdot u_1 - i_1 \cdot u_2}{\text{sgn}(i_1) \cdot i_2 - \text{sgn}(i_2) \cdot i_1} = \frac{PD13 - PD14}{DD1} = \frac{DD10}{DD1}$$

$$U_{LB} = \frac{i'_2 \cdot u_1 - i'_1 \cdot u_2}{i'_2 - i'_1} = \frac{PD15 - PD16}{DD11} = \frac{DD12}{DD11}$$

$$U_{LB} = \frac{i'_2 \cdot u_1 - i'_1 \cdot u_2}{\text{sgn}(i_1) \cdot i'_2 - \text{sgn}(i_2) i'_1} = \frac{PD15 - PD16}{DD13} = \frac{DD12}{DD13}$$

The arc voltage ULB can be calculated through the inventive use of three different value pairs.

For example, the arc voltage ULB can be calculated according to the invention as follows by way of one of the following formulae:

$$U_{LB} = \frac{(u_3 i_1 - u_1 i_3)(i'_2 i_1 - i'_1 i_2) - (u_2 i_1 - u_1 i_2)(i'_3 i_1 - i'_1 i_3)}{(i_2 - i_1)(i'_3 i_1 - i'_1 i_3) - (i_3 - i_1)(i'_2 i_1 - i'_1 i_2)}$$

$$U_{LB} = \frac{(PD1 - PD2)(PD3 - PD4) - (PD5 - PD6)(PD7 - PD8)}{(DD9)(PD7 - PD8) - (DD14)(PD3 - PD4)}$$

$$U_{LB} = \frac{DD3 * DD4 - DD5 * DD6}{DD9 * DD6 - DD14 * DD4}$$

$$U_{LB} = \frac{PD9 - PD10}{PD17 - PD18} = \frac{DD7}{DD15}$$

or:

$$U_{LB} = \frac{(u_3 i_1 - u_1 i_3)(i'_2 i_1 - i'_1 i_2) - (u_2 i_1 - u_1 i_2)(i'_3 i_1 - i'_1 i_3)}{(\text{sgn}(i_1)i_2 - \text{sgn}(i_2)i_1)(i'_3 i_1 - i'_1 i_3) - (\text{sgn}(i_1)i_3 - \text{sgn}(i_3)i_1)(i'_2 i_1 - i'_1 i_2)}$$

wherein u1, i1, i'1 are the voltage, current and current change values of a first value pair. The indices apply analogously to the second and third value pair.

The abbreviation sgn represents the signum function or sign function. This function assigns a number its sign. This is defined as follows:

sgn(x)=+1, if x>0;

sgn(x)=0, if x=0;

sgn(x)=−1, if x<0.

The above formula is composed of two differences DD1, DD2 of a plurality of products PD1, ..., PD8, which in turn form the basis for differences DD3 to DD6. These can in turn be combined to form products PD9, ..., PD12. These products form the basis for two further differences DD7, DD8, which can be used to calculate the arc voltage. The above formula can be transposed as follows:

$$U_{LB} = \frac{(PD1 - PD2)(PD3 - PD4) - (PD5 - PD6)(PD7 - PD8)}{(DD1)(PD7 - PD8) - (DD2)(PD3 - PD4)} \quad (10)$$

$$U_{LB} = \frac{DD3 * DD4 - DD5 * DD6}{DD1 * DD6 - DD2 * DD4}$$

$$U_{LB} = \frac{PD9 - PD10}{PD11 - PD12}$$

$$U_{LB} = \frac{DD7}{DD8}$$

The threshold comparison can be performed in turn in a manner analogous to FIG. 3. In a first step 1, the arc voltage is calculated continuously.

In a second step 2, the arc voltage is compared in each case with the second threshold value SW2.

If the second threshold value SW2 is exceeded in magnitude, the one second arc fault detection signal is output in a third step 3.

If the threshold value SW is not exceeded, it can be reported that there is no arc fault present in a fourth step 4.

The second threshold value SW2 or the magnitude thereof can be, for example, 30 volts for this case.

Proceeding from approximately 10-20 V for the anode-cathode case, the assumption is based on the fact that still approximately 10 V is additionally required for the arc column.

In general, the threshold value for a low-voltage grid, in particular of 400 V, can be in the range of between 20 and 300 volts, more specifically in the range of between 20 and 70 volts. In particular, values of between 25 and 50 volts appear to be suitable.

According to an embodiment of the invention, the arc fault detection can be combined with further criteria, for example with a further comparison of the magnitude of the electric current of the circuit. The measured current, in particular the root mean square value of the measured current, which can be calculated according to the method of Mann-Morrison, for example, is compared in this case with a third threshold value SW3 and only if this third threshold value SW3 is exceeded and the criterion for an arc fault detection signal is satisfied is such an arc fault detection signal output.

This criterion, identified as overcurrent release, leads to a reliable fault location. For the arc fault detection, a minimum arc fault current must flow in the circuit in order to effect an arc fault detection signal. A value that is dependent on the operating current can be chosen as threshold value for the overcurrent release. As an alternative, the threshold value determination could also take place in an arc-specific manner, since an arc current of usually 1000 A is necessary for a burning parallel low-voltage arc. A series arc is possible given significantly lower currents. That is to say the third threshold value SW3 can assume every value, starting at 1 A, 10 A, 100 A, 1000 A or 5000 A, depending on use or application.

Figure 4:
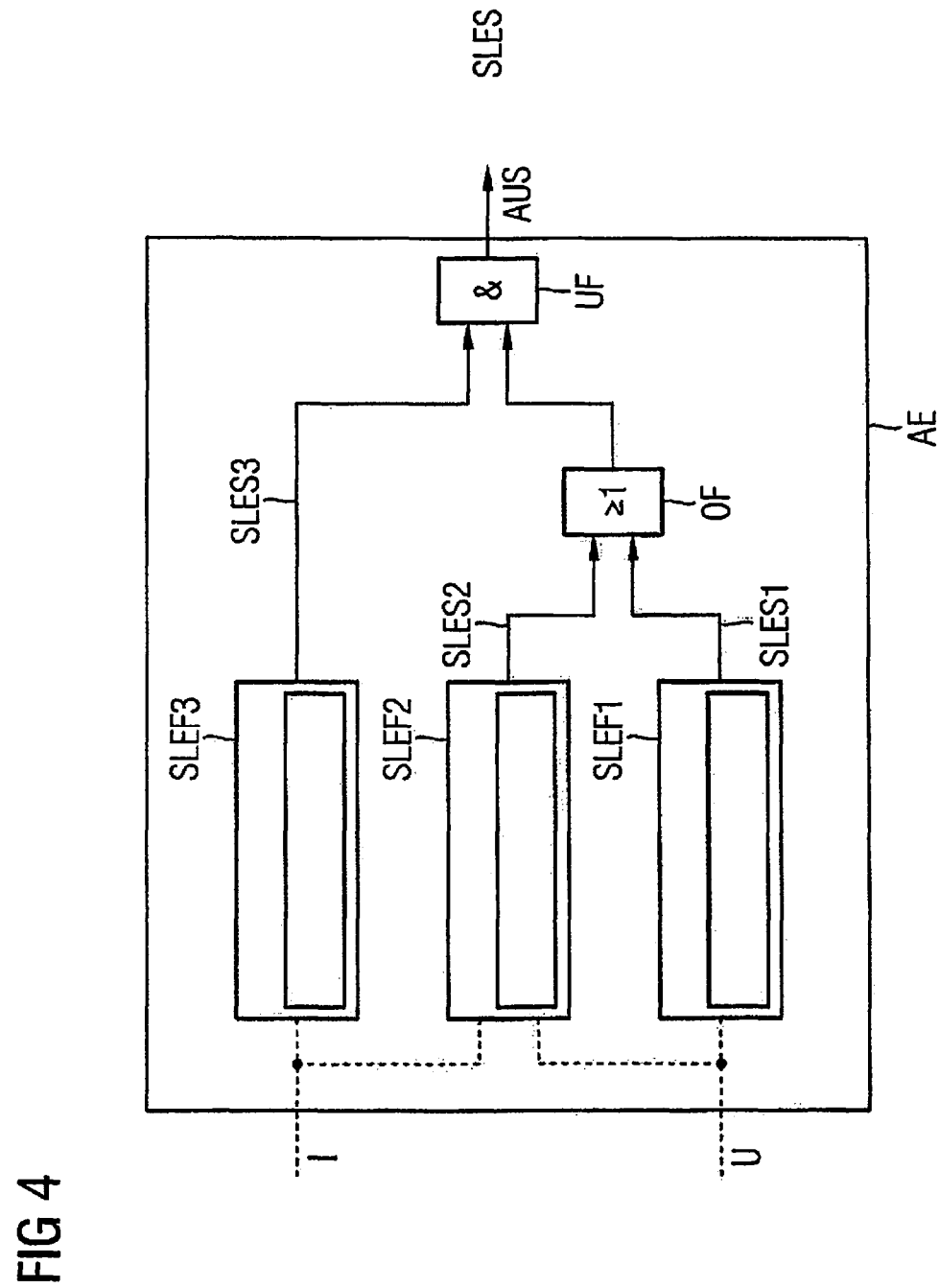
FIG. 4 shows a block circuit diagram of a solution according to an embodiment of the invention

The link between overcurrent release and the arc voltage calculation according to an embodiment of the invention is illustrated in FIG. 4.

FIG. 4 shows an illustration in which the determined voltage U and the determined current variable I of the circuit are fed by way of voltage and current sensors (not illustrated) to a first evaluation unit AE. The voltage U is fed to a first arc fault detection function SLEF1 and to a second arc fault detection function SLEF2. The current variable I is fed to the second arc fault function SLEF2 and to a third arc fault function SLEF3.

The three arc fault detection functions SLEF1, SLEF2, SLEF3 each determine arc faults or arc fault criteria according to different principles.

For example, the first arc fault detection function SLEF1 can carry out arc fault detection by way of the partial sum calculation or W-RU. As an alternative, the first arc fault detection function can also carry out a voltage value difference quotient calculation.

For example, the second arc fault detection function can carry out integrating or differentiating determination of the arc voltage.

For example, the third arc fault detection function can carry out a check with respect to certain current conditions.

Other combinations and nestings of the mentioned methods are conceivable and included.

It is essential that at least two different arc fault detection functions, that is to say two different methods, are used. Optimally, three or else more methods can be used in parallel.

The combination of partial sum calculation/W-RU and integrating determinations has proven to be particularly advantageous, optimally in combination with overcurrent release. A particularly good detection of arc faults can be achieved hereby.

The outputs of the first two arc fault detection functions SLEF1, SLEF2, which each output a respective first and/or second arc fault detection signal SLES1, SLES2 upon detection of an arc fault, are connected to an OR function OF. The output of the third arc fault detection function SLEF3 and the output of the OR function OF are connected to an AND function UF. The output of the AND function forms the output AUS of the evaluation unit AE.

That is to say that, in the presence of a first or second arc fault detection signal SLES1, SLES2 and in the presence of a third arc fault detection signal SLES3, an arc fault detection signal SLES is output at the output of the evaluation unit AE.

The evaluation unit does not have to be realized here as a closed assembly but may be constructed in a decentralized manner. For example, the evaluation unit may be realized by way of a microprocessor, which carries out the evaluations according to an embodiment of the invention.

Furthermore, the output of an arc fault detection signal can only take place when at least corresponding evaluation values and/or the current criterion exceed/exceeds the corresponding threshold value at least twice. In an analogous manner, exceeding of the threshold value three times, four times, five times, etc. can also lead to the output of an arc fault detection signal. Particularly reliable evaluation and detection of an arc fault is thus achieved.

Figure 5:
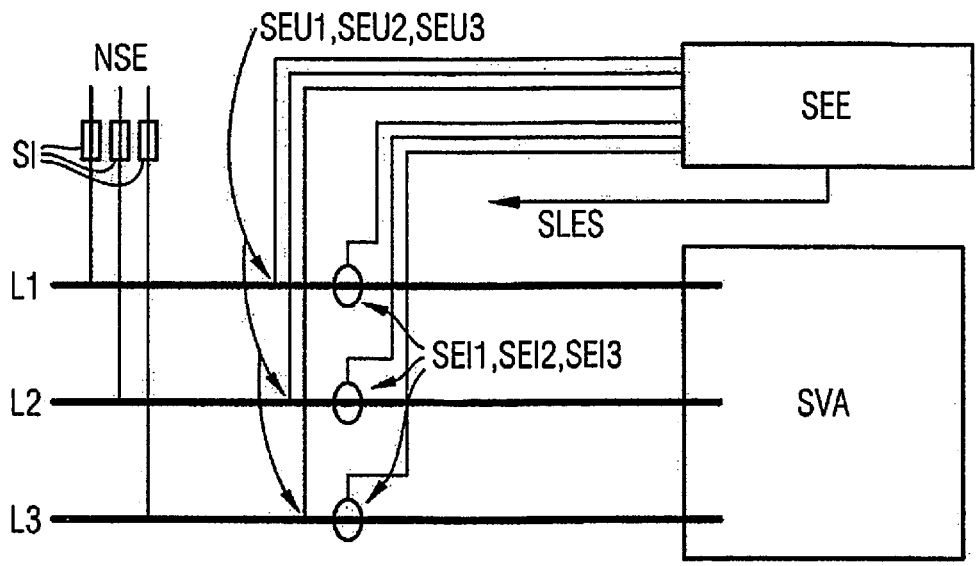
FIG. 5 shows a first illustration for explaining the use of an embodiment of the invention

FIG. 5 shows a schematic illustration of an outline circuit diagram for a system configuration with an output-selective arc fault detection unit for the detection of arc faults. FIG. 5 shows a low-voltage infeed NSE, with fuses SI, which are followed by busbars or bars L1, L2, L3 for the conductors of a three-phase AC grid or circuit. The neutral conductor or zero conductor is not illustrated. Each of the three busbars L1, L2, L3 is assigned a respective voltage sensor SEU1, SEU2, SEU3 and a current sensor SEI1, SE12, SE13. The busbars are connected to a switching and/or distribution system SVA.

The voltage and current sensors are connected to an arc fault detection unit SEE according to an embodiment of the invention, which has an evaluation unit AE according to an embodiment of the invention. The latter has an output for outputting an arc fault detection signal SLES.

The voltage and current sensors determine voltage values and current variables (current value and/or current value change) of the busbars L1, L2, L3 and guide them to the arc fault detection unit SEE according to an embodiment of the invention.

The sensors are in this case arranged outside of the arc fault detection unit and are connected thereto.

Figure 6:
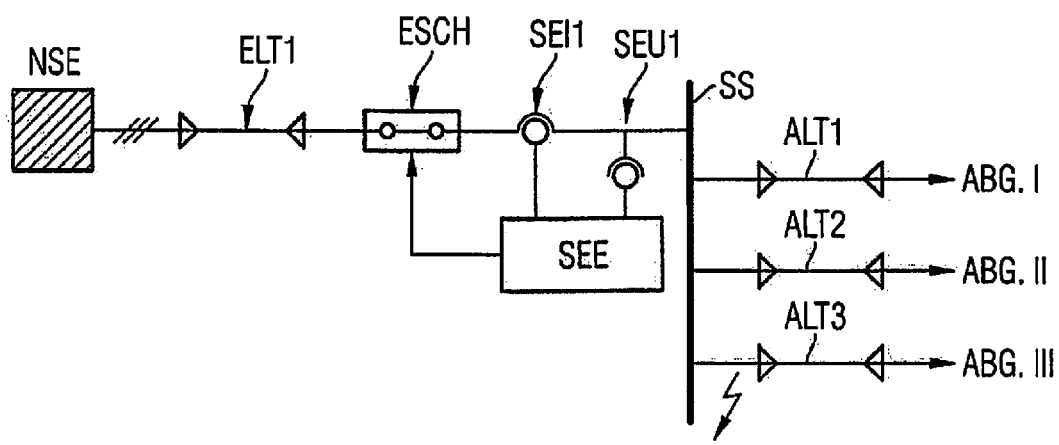
FIG. 6 shows a second illustration for explaining the use of an embodiment of the invention

FIG. 6 shows a further schematic illustration of an outline circuit diagram for a system configuration comprising a central arc fault detection unit for the detection of arc faults. FIG. 6 shows a low-voltage infeed NSE, which is followed by an infeed cable ELT1, which is followed by an infeed switch ESCH, which is followed by a current sensor SEI1 and a voltage sensor SEU1, which is followed by a busbar SS. Three outputs ABG I, ABG II and ABG III are provided on the busbar SS. A respective output cable ALT1, ALT2, ALT3 is assigned to the outputs.

The sensors SEI1, SEU1 are connected to an arc fault detection unit SEE, the output of which is connected in turn to the infeed switch ESCH. The infeed switch can in this case be a circuit breaker. Upon detection of an arc fault, the electrical circuit, that is to say the power supply of the busbar SS, can be interrupted when an arc fault occurs, for example, in one of the outputs.

Figure 7:
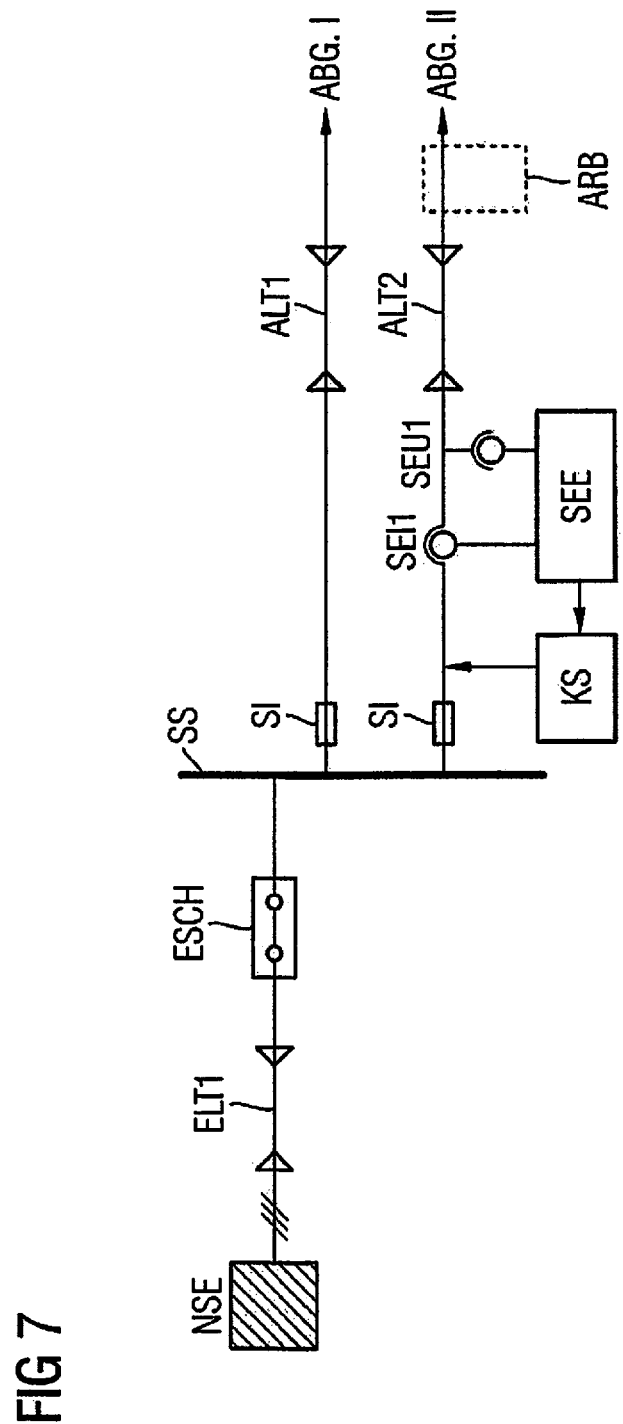
FIG. 7 shows a third illustration for explaining the use of an embodiment of the invention.

FIG. 7 shows an illustration according to FIG. 6, with the difference that the sensors are arranged in the second output AGB II, which also has fuses SI and a short-circuiting device KS. The sensors SEI1 and SEU1 capture current and voltage values of the output ABG II and transfer the values to the arc fault detection unit SEE. If the arc fault detection unit SEE detects an arc fault, an arc fault detection signal SLES is output at its output and is transmitted to the short-circuiting device KS. The latter then short-circuits the output ABG II in order to extinguish the arc fault.

The arc fault detection according to FIG. 6 or 7 may be embodied, for example, as a mobile system.

An embodiment of the invention is intended to be explained once again below.

Arc faults, in particular parallel or powerful arc faults can be detected, in particular in low-voltage switching and distribution systems, by way of the invention. According to an embodiment of the invention, in particular, a numerical solution or detection algorithm on the basis of the evaluation of measured voltage and current values or signals is available for this purpose. For detecting arc faults, in particular, the voltage is measured, and an arc fault is determined with the aid of a calculation according to an embodiment of the invention. On account of the rapid arc detection, which is required in practice, a remarkably rapid temporal evaluation can be provided in this case according to an embodiment of the invention.

Powerful arc faults, for example in switching and distribution systems, for example with a low voltage, can be detected rapidly by way of an embodiment of the invention, for example on the basis of a central voltage and current measurement at the infeed.

An embodiment of the invention can be used, in particular, in an advantageous manner in or in interaction with circuit breakers or short-circuiting devices.

An extensive installation of optical waveguides in systems for arc fault detection is not necessary. The voltage/current measurement can be realized in a centralized manner and, if applicable, can be used by further operating device(s).

An implementation in available switching and distribution systems is furthermore easily possible since a detection system according to an embodiment of the invention can be installed, for example, only centrally and installation in individual cells that are to be protected is not necessary.

An embodiment of the invention can be realized as an assembly comprising central voltage and current determination.

The detection systems that have been established on the market until now are based on optical fault detection and therefore have the potential for faulty tripping owing to the impact of extraneous light (for example flash light). In the case of the solution according to the invention on the basis of a voltage and current measurement, this risk potential is not present.

Even though the invention has been illustrated and described in more detail by way of the example embodiment, the invention is not limited by the disclosed examples and other variations can be derived therefrom by a person skilled in the art, without departing from the scope of protection of the invention.

LIST OF REFERENCE SIGNS

A amps
ABG I output I
ABG II output II
ABG III output III
AE evaluation unit
AE1 first evaluation (sub)unit
AE2 second evaluation (sub)unit
ALT 1 output cable 1
ALT 2 output cable 2
ALT 3 output cable 3
ARB operating area
AUS outlet
ELT1 infeed cable 1
ESCH infeed switch, circuit breaker
I electric current
$I_{LB}$ arc current
$i_m$ current value, measured
$i'_m$ value of the change in the current value
KS short-circuiting device
$L_{BM}$ inductance, load
$L_{EK}$ inductance, infeed cable
L1 busbar, conductor 1
L2 busbar, conductor 2
L3 busbar, conductor 3
ms milliseconds
NSE low-voltage infeed
OF OR function
$R_{BM}$ resistance, load
$R_{EK}$ resistance, infeed cable
SEE arc fault detection unit
SLEF1 first arc fault detection function
SLEF2 second arc fault detection function
SLEF3 third arc fault detection function
SEI1 current sensor
SEI2 current sensor
SEI3 current sensor
SEU1 voltage sensor
SEU2 voltage sensor
SEU3 voltage sensor
SLES arc fault detection signal
SLES1 first arc fault detection signal
SLES2 second arc fault detection signal
SLES3 third arc fault detection signal
SI fuse
SS bus
SVA switching and distribution system
SW1 threshold value arc voltage
SW2 threshold value arc voltage
SW3 threshold value current release
SW4 threshold value voltage difference quotient
SW5 fifth threshold value
SW6 sixth threshold value
t time
U electrical voltage
UF AND function
$U_{LB}$ arc voltage
$u_m$ voltage value, measured
$u_n$ voltage value, power source/grid
V volts
& AND unit
1 step 1—continuous calculation
2 step 2—threshold value comparison
3 step 3—output arc fault detection signal
4 step 4—no arc fault
100 power source
200 grid access/infeed cable
300 load/operating device(s)/energy sink
400 arc
500 monitored area
600 measuring points

The invention claimed is:

1. An arc fault detection unit for an electrical circuit, comprising:
at least one voltage sensor assigned to the electrical circuit, to periodically determine electrical voltage values of the electrical circuit; and
at least one current sensor assigned to the electrical circuit, to periodically determine electric current variables of the circuit, the at least one voltage sensor and the at least one current sensor being connected to an evaluation unit, the evaluation unit being configured to
feed the electrical voltage values to a first arc fault detection function, to carry out a first arc fault detection based upon a signal profile of the voltage, compare the signal profile to a first threshold value, and to output a first arc fault detection signal upon the electrical voltage values exceeding the first threshold value in magnitude,
feed the electrical voltage values and electric current variables to a second arc fault detection function, to carry out a second arc fault detection based upon the electrical voltage values and current variables, compare at least one of the electrical voltage values and electric current variables to a second threshold value and to output a second arc fault detection signal upon the at least one of the electrical voltage values and electric current variables exceeding the second threshold value in magnitude, and
feed the first arc fault detection signal and the second arc detection signal to an OR function to, upon either of the first arc fault detection signal and second arc fault detection signal being present, output an OR-linked arc fault detection signal as an output-side arc fault detection signal.

2. The arc fault detection unit of claim 1, wherein the evaluation unit is configured to
feed the electric current variables to a third arc fault detection function, to continuously compare the electric current variables or an equivalent of the electric current variables with a third threshold value, compare the electric current variables or an equivalent of the electric current variables with the third threshold value and to output a third arc fault detection signal upon the electric current variables or an equivalent of the electric current variables exceeding the third threshold value in magnitude, wherein the OR-linked arc fault detection signal and the third arc fault detection signal are fed to an AND function such the output-side arc fault detection signal is output by the arc fault detection unit only upon the third arc fault detection signal and the OR-linked arc fault detection signal being present.

3. The arc fault detection unit of claim 2, wherein the first arc fault detection function continuously sums a first half of a first number of electrical voltage values to form a first partial sum and continuously sums a second half of electrical voltage values to form a second partial sum, a difference of the first partial sum and the second partial sum is determined, and the difference is compared with the first threshold value and, upon the first threshold value being exceeded in magnitude by the difference, the first arc fault detection signal is output.

4. The arc fault detection unit of claim 2, wherein the first arc fault detection function continuously determines a voltage difference from two temporally successive electrical voltage values, wherein the voltage difference is divided by a temporal difference of the two temporally successive electrical voltage values, a difference quotient is determined from the dividing as measure of change in voltage over the time, compares the difference quotient is compared to a fourth threshold value instead of the first threshold value and, upon the fourth threshold value being exceeded in magnitude by the difference quotient, the first arc fault detection signal is output.

5. The arc fault detection unit of claim 2, wherein at least one of an electric current value and a value for a change in the electric current over the time is determined as the electric current variable.

6. The arc fault detection unit of claim 1, wherein the electrical circuit is a low-voltage circuit.

7. The arc fault detection unit of claim 6, wherein the electrical circuit is an AC- circuit.

8. The arc fault detection unit of claim 1, wherein at least one of the electrical voltage values and the electric current variables are determined with a fixed time interval.

9. The arc fault detection unit of claim 1, wherein the first arc fault detection function continuously sums a first half of a first number of electrical voltage values to form a first partial sum and continuously sums a second half of electrical voltage values to form a second partial sum, a difference of the first partial sum and the second partial sum is determined, and the difference is compared with the first threshold value and, upon the first threshold value being exceeded in magnitude by the difference, the first arc fault detection signal is output.

10. The arc fault detection unit of claim 1, wherein the first arc fault detection function continuously determines a voltage difference from two temporally successive electrical voltage values, wherein the voltage difference is divided by a temporal difference of the two temporally successive electrical voltage values, a difference quotient is determined from the dividing as measure of change in voltage over the time, compares the difference quotient is compared to a fourth threshold value instead of the first threshold value and, upon the fourth threshold value being exceeded in magnitude by the difference quotient, the first arc fault detection signal is output.

11. The arc fault detection unit of claim 1, wherein at least one of an electric current value and a value for a change in the electric current over the time is determined as the electric current variable.

12. The arc fault detection unit of claim 11, wherein, upon the electric current value being determined as the electric current variable, a value for a change in electric current over the time is determined from the electric current value, upon a value for the change in the electric current over the time being determined, the electric current value is determined from the value for the change in the electric current over the time, to form a value pair including a voltage value, a current value and a value for the change in the current over the time.

13. The arc fault detection unit of claim 12, wherein the second arc fault detection function continuously calculates an arc voltage, from at least two value pairs, the arc voltage then being compared with the second threshold value and, upon the arc voltage exceeding the second threshold value in magnitude, the second arc fault detection signal is output.

14. The arc fault detection unit of claim 13, wherein the second arc fault detection function continuously calculates an arc voltage from three value pairs.

15. The arc fault detection unit of claim 12, wherein a value set includes a plurality of value pairs and wherein the second arc fault detection function continuously calculates an arc voltage from at least two value sets, the arc voltage being compared with the second threshold value and, upon the second threshold value being exceeded in magnitude by the arc voltage, the second arc fault detection signal is output.

16. The arc fault detection unit of claim 11, wherein the second arc fault detection function continuously calculates an arc voltage, from at least two value pairs, the arc voltage then being compared with the second threshold value and, upon the arc voltage exceeding the second threshold value in magnitude, the second arc fault detection signal is output.

17. The arc fault detection unit of claim 16, wherein the second arc fault detection function continuously calculates an arc voltage from three value pairs.

18. The arc fault detection unit of claim 17, wherein the second arc fault function is configured such that the calculation of the arc voltage is carried out via a differential equation or a solution of the differential equation.

19. The arc fault detection unit of claim 16, wherein the second arc fault function is configured such that the calculation of the arc voltage is carried out via a differential equation or a solution of the differential equation.

20. The arc fault detection unit of claim 11, wherein a value set includes a plurality of value pairs and wherein the second arc fault detection function continuously calculates an arc voltage from at least two value sets, the arc voltage being compared with the second threshold value and, upon the second threshold value being exceeded in magnitude by the arc voltage, the second arc fault detection signal is output.

21. The arc fault detection unit of claim 20, wherein the second arc fault detection function continuously calculates an arc voltage from three value sets.

22. The arc fault detection unit of claim 20, wherein the second arc fault function is configured such that the calculation of the arc voltage is carried out via an integral equation or a solution to the integral equation.

23. A circuit breaker for a low-voltage electrical circuit, comprising:
the arc fault detection unit of claim 1, connected to the circuit breaker, configured such that, upon an output-side arc fault detection signal being output, the circuit breaker trips to interrupt the electrical circuit.

24. A short-circuiting device, comprising:

the arc fault detection unit of claim 1, connected to the short-circuiting device, configured such that, upon an output-side arc fault detection signal being output, the short-circuiting device short-circuits the electrical circuit to cause extinguishing of the arc fault.

25. A method for arc fault detection for an electrical circuit, comprising:

periodically ascertaining electrical voltage values and current variables of the electrical circuit;

feeding the electrical voltage values to a first arc fault detection function, to carry out a first arc fault detection based upon a signal profile of the voltage by comparing the signal profile to a first threshold value;

outputting a first arc fault detection signal, upon the comparing indicating that the electrical voltage values periodically ascertained exceeding the first threshold value in magnitude;

feeding the electrical voltage values and current variables to a second arc fault detection function, to carry out a second arc fault detection based upon the electrical voltage values and current variables by comparing the electrical voltage values periodically ascertained, to a second threshold value;

outputting a second arc fault detection signal, upon the comparing indicating that the electrical voltage values periodically ascertained exceed the first threshold value in magnitude;

feeding the first arc fault detection signal and the second arc fault detection signal to an OR function; and outputting an OR-linked arc fault detection signal as an output-side arc fault detection signal.

26. The method of claim 25, further comprising:

feeding the electric current variables to a third arc fault detection function, the third arc fault detection function continuously comparing the current variable or an equivalent of the current variable, with a third threshold value and, upon the comparing indicating that the third threshold value is exceeded in magnitude, outputting a third arc fault detection signal; and feeding the OR-linked arc fault detection signal and the third arc fault detection signal to an AND function , wherein the output-side arc fault detection signal is output by the arc fault detection unit only upon the AND function receiving the third arc fault detection signal and the OR-linked arc fault detection signal.

* * * * *